(12) United States Patent
Napetschnig et al.

(10) Patent No.: US 10,276,362 B2
(45) Date of Patent: Apr. 30, 2019

(54) METHOD FOR PROCESSING A SEMICONDUCTOR REGION AND AN ELECTRONIC DEVICE

(71) Applicant: Infineon Technologies AG, Neubiberg (DE)

(72) Inventors: Evelyn Napetschnig, Diex (AT); Sandra Wirtitsch, Bad Bleiberg (AT); Mario Barusic, Seeboden (AT); Aleksander Hinz, Villach (AT); Robert Hartl, Regensburg (DE); Georg Schinner, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 139 days.

(21) Appl. No.: 15/141,855

(22) Filed: Apr. 29, 2016

(65) Prior Publication Data

US 2017/0316934 A1 Nov. 2, 2017

(51) Int. Cl.
*H01L 21/02* (2006.01)
*H01L 21/324* (2006.01)
*H01L 21/225* (2006.01)
*H01L 21/306* (2006.01)
*H01L 29/167* (2006.01)

(52) U.S. Cl.
CPC .... *H01L 21/02068* (2013.01); *H01L 21/0209* (2013.01); *H01L 21/02082* (2013.01); *H01L 21/2251* (2013.01); *H01L 21/30604* (2013.01); *H01L 21/3247* (2013.01); *H01L 29/167* (2013.01)

(58) Field of Classification Search
None
See application file for complete search history.

(56) References Cited

U.S. PATENT DOCUMENTS

2013/0228903 A1* 9/2013 Schmidt .............. H01L 21/3221
257/655

* cited by examiner

*Primary Examiner* — Alexander G Ghyka
(74) *Attorney, Agent, or Firm* — Viering, Jentschura & Partner MBB

(57) ABSTRACT

According to various embodiments, a method for processing a semiconductor region, wherein the semiconductor region comprises at least one precipitate, may include: forming a precipitate removal layer over the semiconductor region, wherein the precipitate removal layer may define an absorption temperature at which a chemical solubility of a constituent of the at least one precipitate is greater in the precipitate removal layer than in the semiconductor region; and heating the at least one precipitate above the absorption temperature.

19 Claims, 16 Drawing Sheets

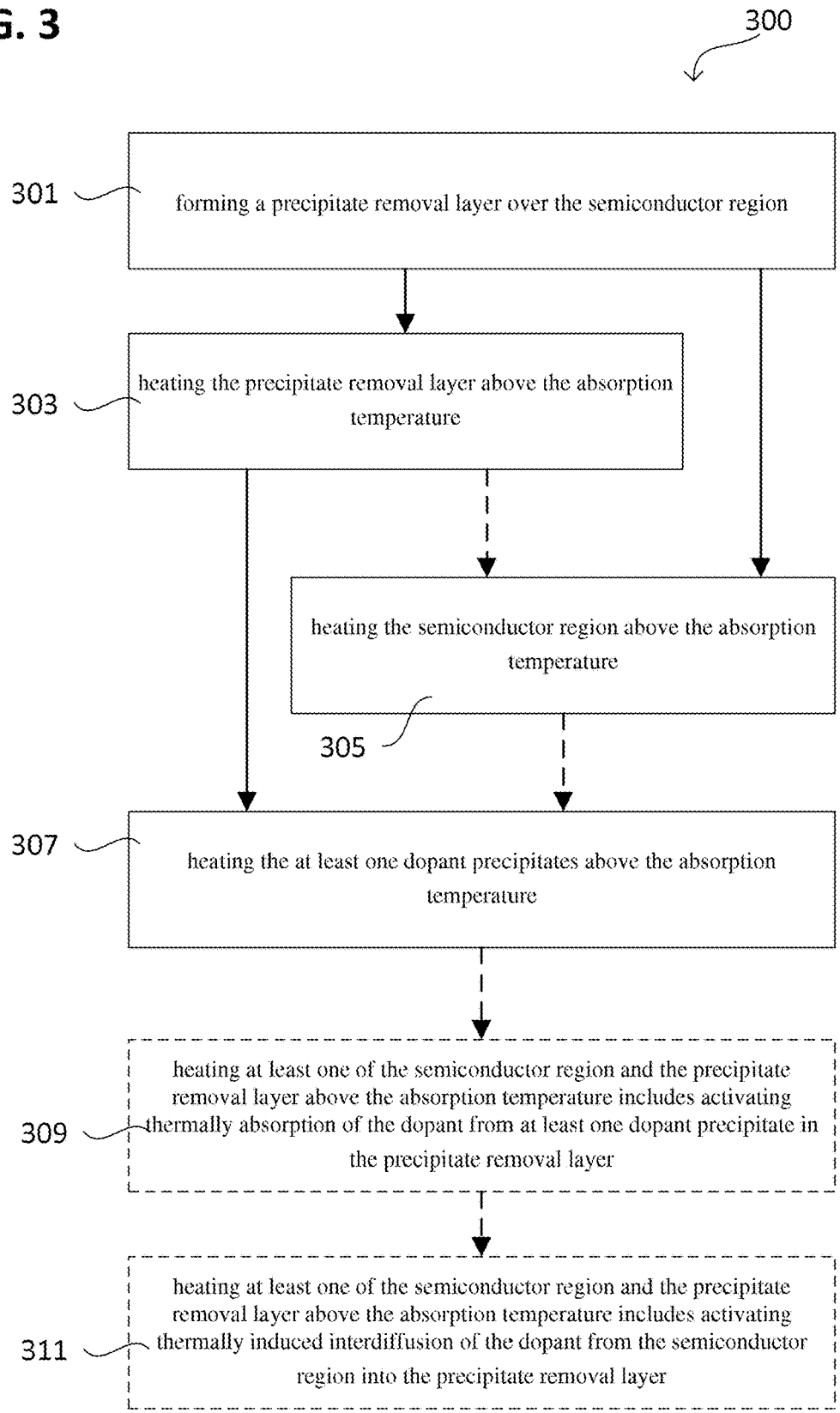

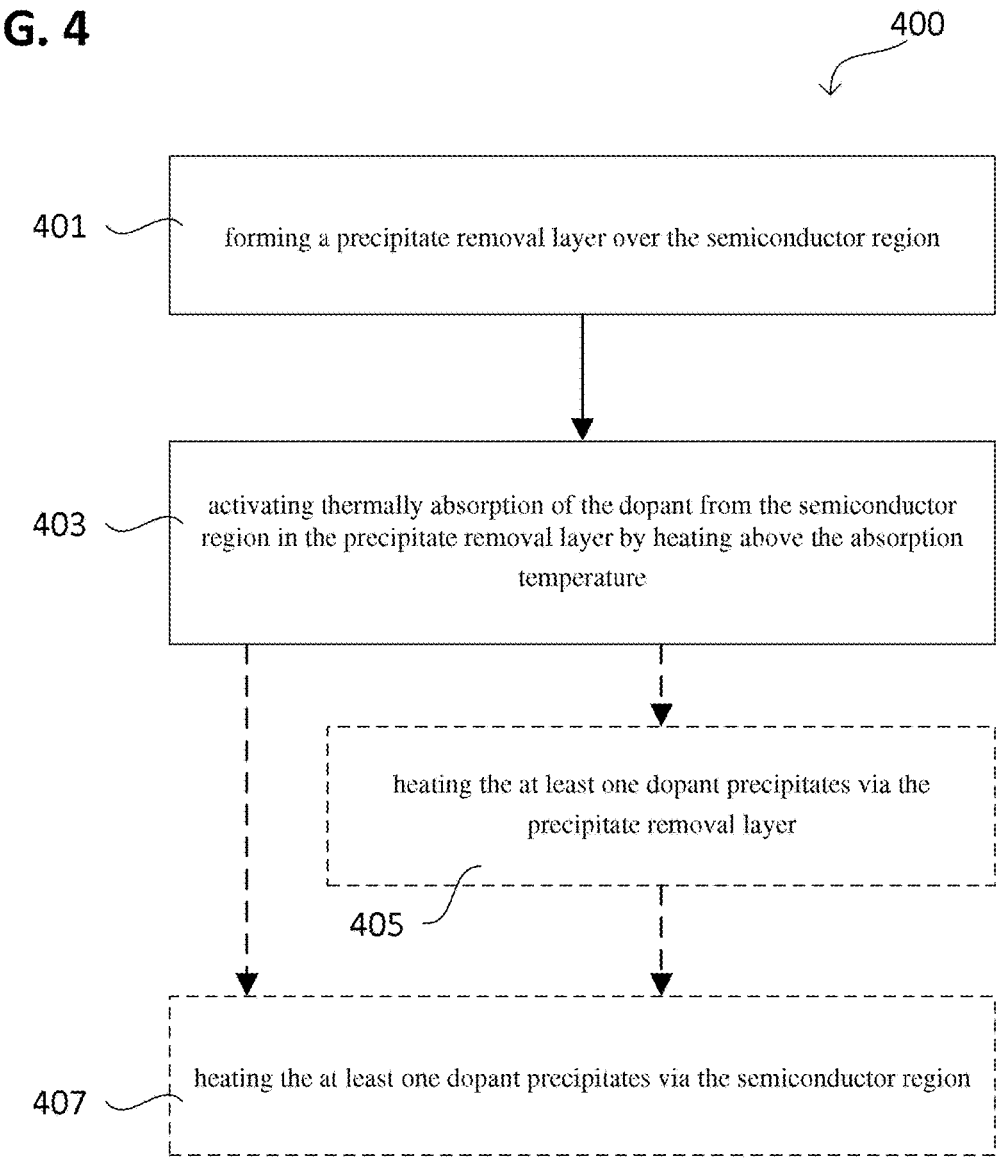

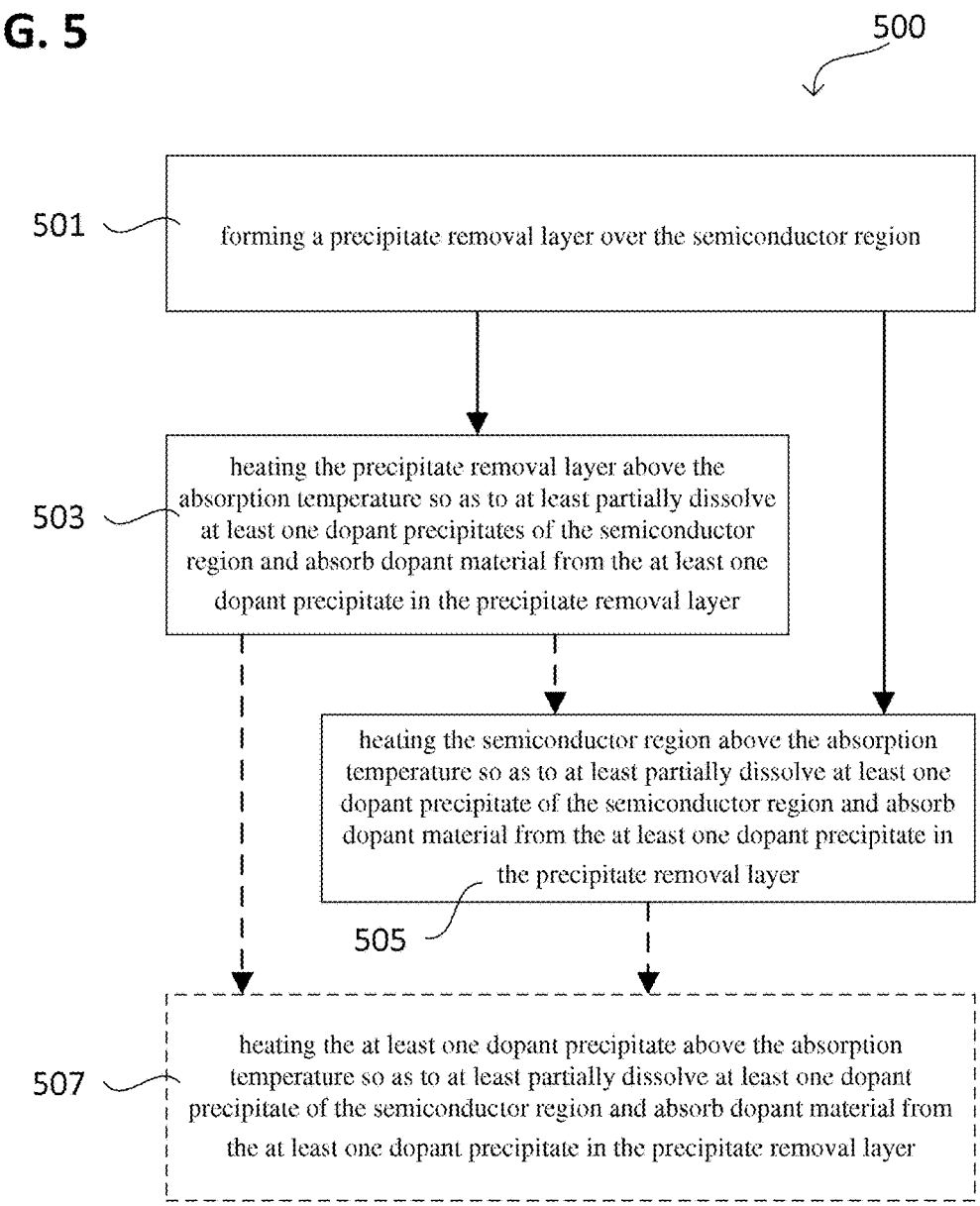

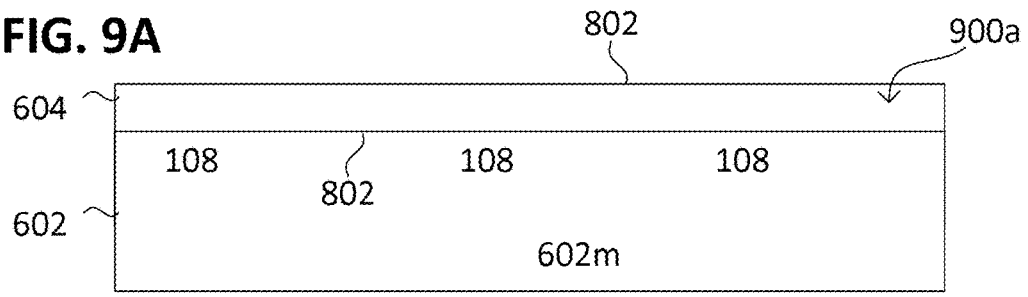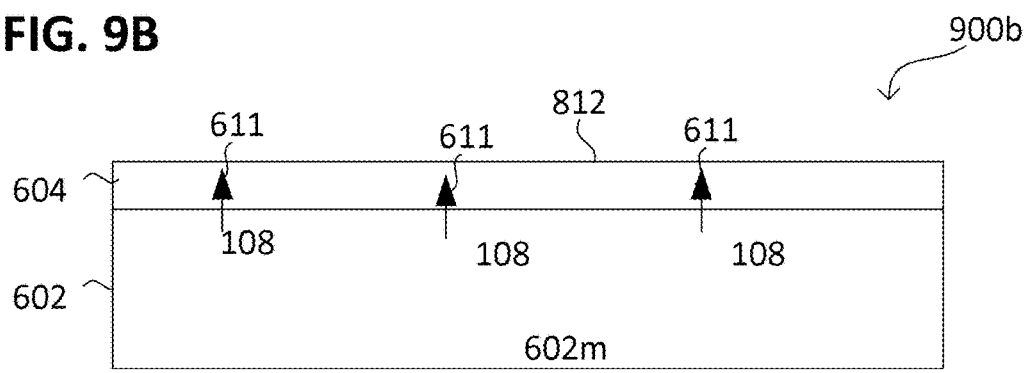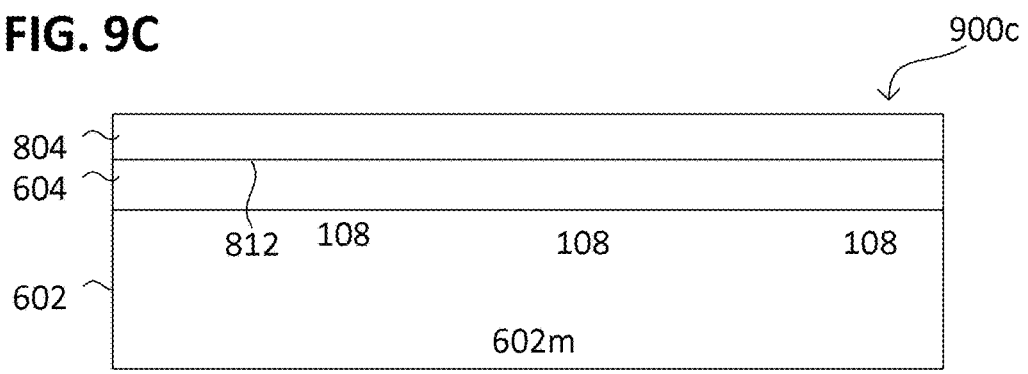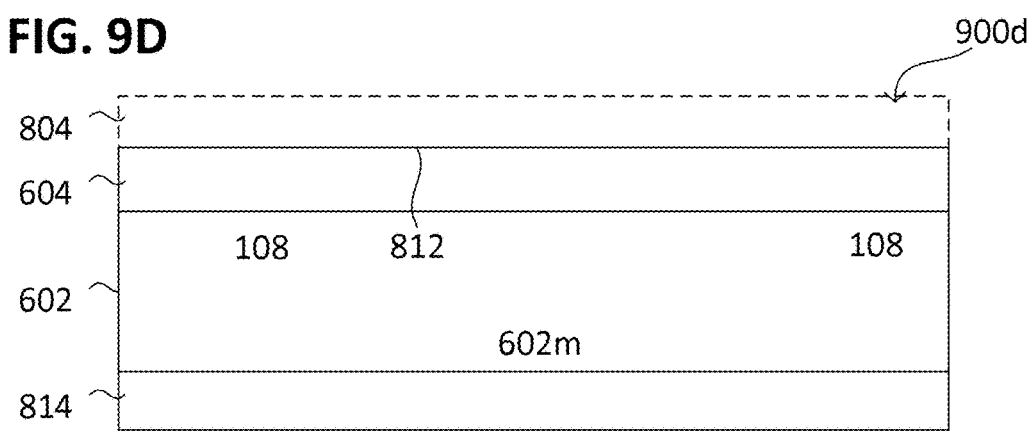

METHOD FOR PROCESSING A SEMICONDUCTOR REGION AND AN ELECTRONIC DEVICE

TECHNICAL FIELD

Various embodiments relate generally to a method for processing a semiconductor region and an electronic device.

BACKGROUND

In general, semiconductor materials may be processed in semiconductor technology on or in a substrate (also referred to as a wafer or a carrier), e.g. to fabricate integrated circuits (also referred to as chips). During fabricating integrated circuits, certain processes may be applied, such as doping the semiconductor materials, planarizing the substrate, forming one or more layers over the substrate, structuring the one or more layers, or contacting the readily fabricated chips.

Conventionally, planarizing uses a chemical polishing process and/or mechanical polishing process. Due to quality criteria, adapting the setup of this process to various technologies, various wafer diameters and various wafer (e.g., silicon) thicknesses may be difficult. Further, the process parameter window may be very narrow, which increases the effort for aligning the process of multiple tools such as to increase reproducibility.

In several processes, the used materials may chemically react with each other and may be, depending on their phase diagrams, converted into parasitic phases, such as precipitates, inclusions, mixed crystals and allotrope modifications, e.g., in micrometer scale. Those parasitic phases may differ in their mechanical and chemical properties from the primary phase, and therefore may complicate the planarizing. For example, a mechanically and/or chemically stable parasitic phase may be resistant against the planarizing.

By way of example, $Pt_xSi_y$ grains may form at the front side of the substrate. FIG. 1A illustrates $Pt_xSi_y$ grains 102 on a substrate surface, which appear darker in the microscopy image. Conventionally, there may be no planarization process applicable for removing the $Pt_xSi_y$ grains without damaging the substrate. Thus, the $Pt_xSi_y$ grains are conventionally overgrown by following layers, e.g., by electroless plating (also referred to as e-less plating). For example, the $Pt_xSi_y$ grains may be covered by an AlSiCu layer, which may be subsequently covered by NiP plating. During the e-less plating process, the AlSiCu layer proximate the $Pt_xSi_y$ grains may be etched away, e.g., in particular for extraordinarily large scale $Pt_xSi_y$ grains. The resulting recess in the AlSiCu layer may lead to an inhomogeneous NiP plating 104 proximate the $Pt_xSi_y$ grains (e.g., leading to optically detectable defects). FIG. 1B illustrates a resulting inhomogeneity 104 in a top view and cross sectional FIB (focused ion beam) image. The resulting inhomogeneities 104 increase the risk of malfunction of the readily fabricated chip and reduce its reliability.

By way of example, $Pt_xSi_y$ grains may form at the backside of the substrate. The backside may be conventionally planarized by a chemical polishing process, e.g., for thinning the substrate. However, the chemical polishing process may be limited in reducing the surface roughness, since the $Pt_xSi_y$ grains may be resistant against the chemical polishing process. In other words, the $Pt_xSi_y$ grains may remain unmodified during the chemical polishing process. However, if the applied mechanical force is high enough, the $Pt_xSi_y$ grains may be torn out of the substrate (e.g., made from silicon) resulting in a nonsymmetrical recess in the substrate (illustratively, a "crater"). FIG. 2A is a microscopy image that illustrates nonsymmetrical recesses 202 in a substrate, which appear darker in the microscopy image. The remaining surface roughness may increase through metal diffusion into the substrate (e.g., during forming a backside metallization) and, thereby, reduce the solderability (e.g., for die attach) and/or increase the risk of peeling off (e.g., at a pick up process). FIG. 2B illustrates metal diffusion related inhomogeneities 204 as well as voids 206 in a metallization. The resulting inhomogeneities 204 and voids 206 increase the risk of malfunction of a readily fabricated chip and reduce its reliability.

SUMMARY

According to various embodiments, a method for processing a semiconductor region, wherein the semiconductor region comprises at least one precipitate, may include: forming a precipitate removal layer over the semiconductor region, wherein the precipitate removal layer defines an absorption temperature at which a chemical solubility of a constituent of the at least one precipitate is greater in the precipitate removal layer than in the semiconductor region; and heating the at least one precipitate above the absorption temperature.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3 to 5 respectively show a method according to various embodiments;

FIGS. 9A to 9D respectively show an electronic device in a method according to various embodiments;

DESCRIPTION

Figure 1A:
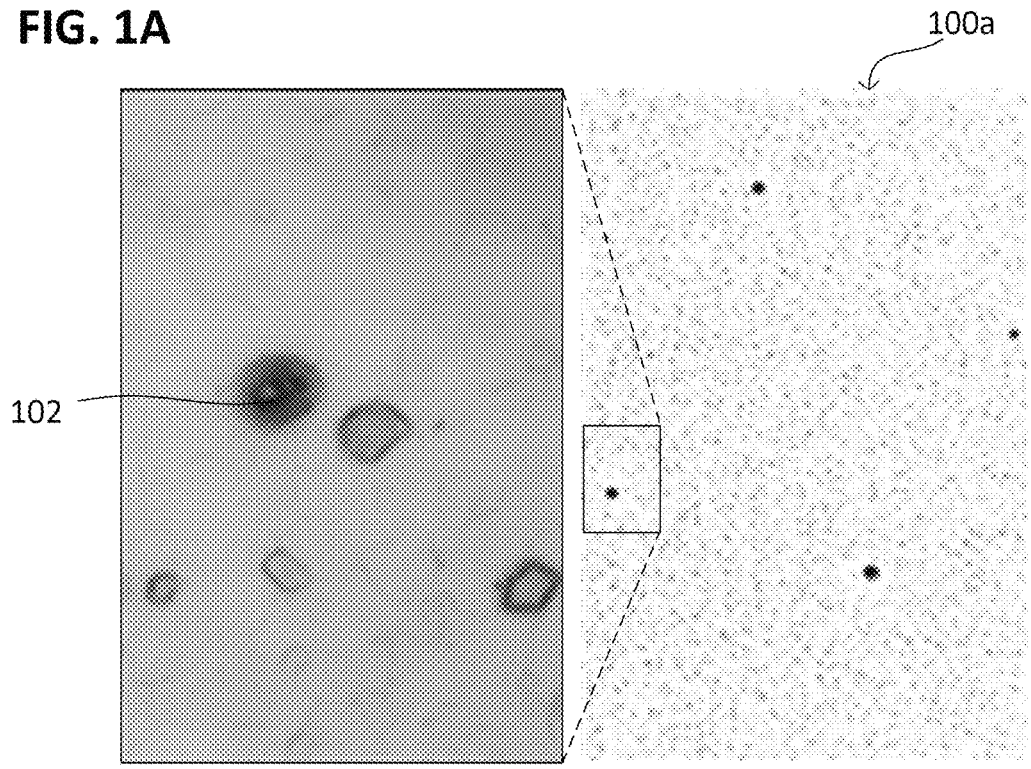
FIGS. 1A to 2B respectively show conventional metallization.
Figure 1B:
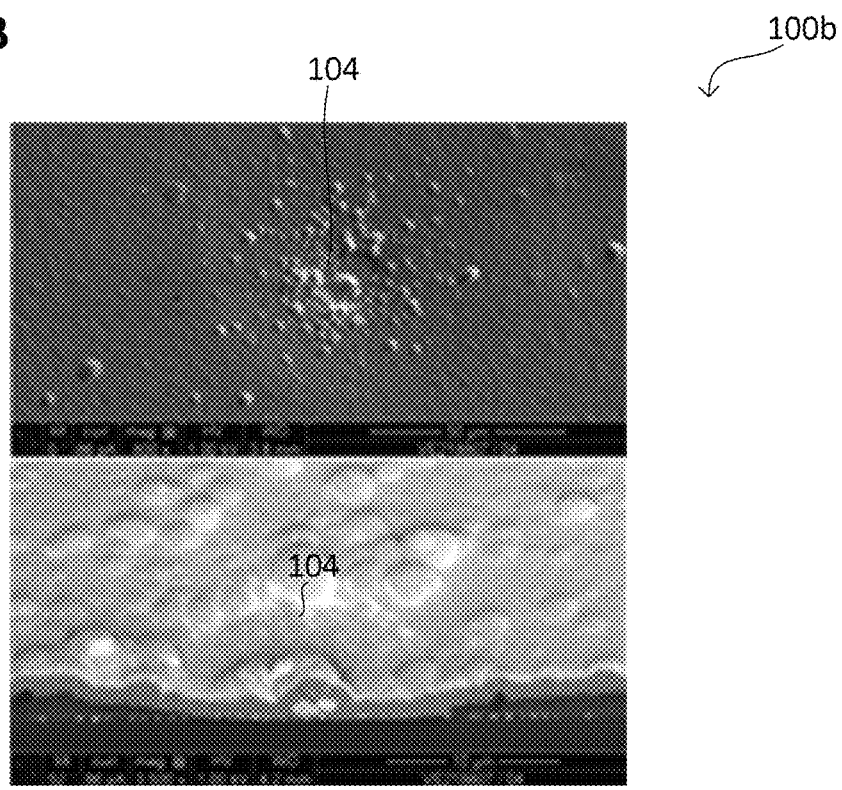
Figure 2A:
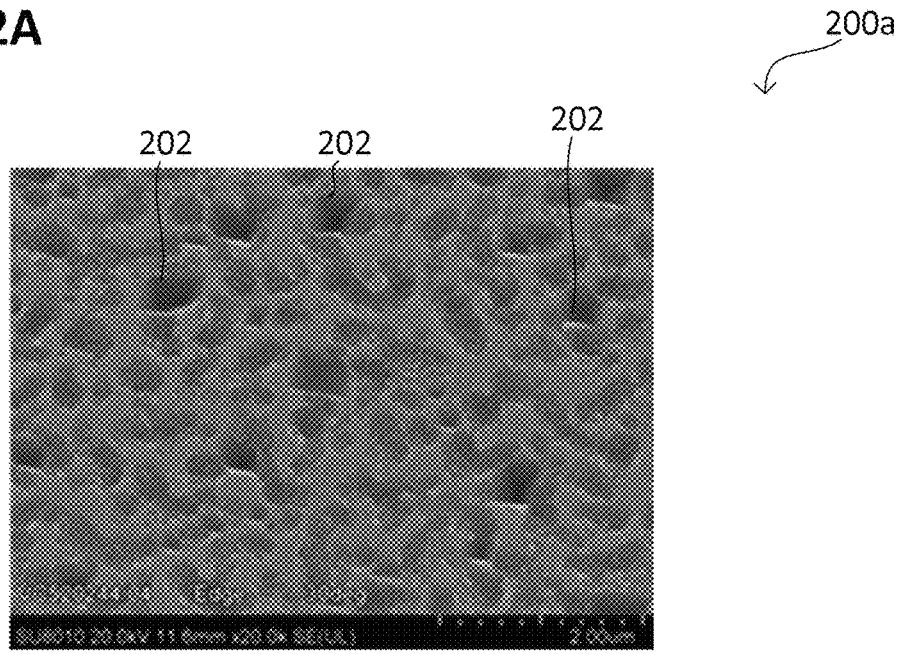
Figure 2B:
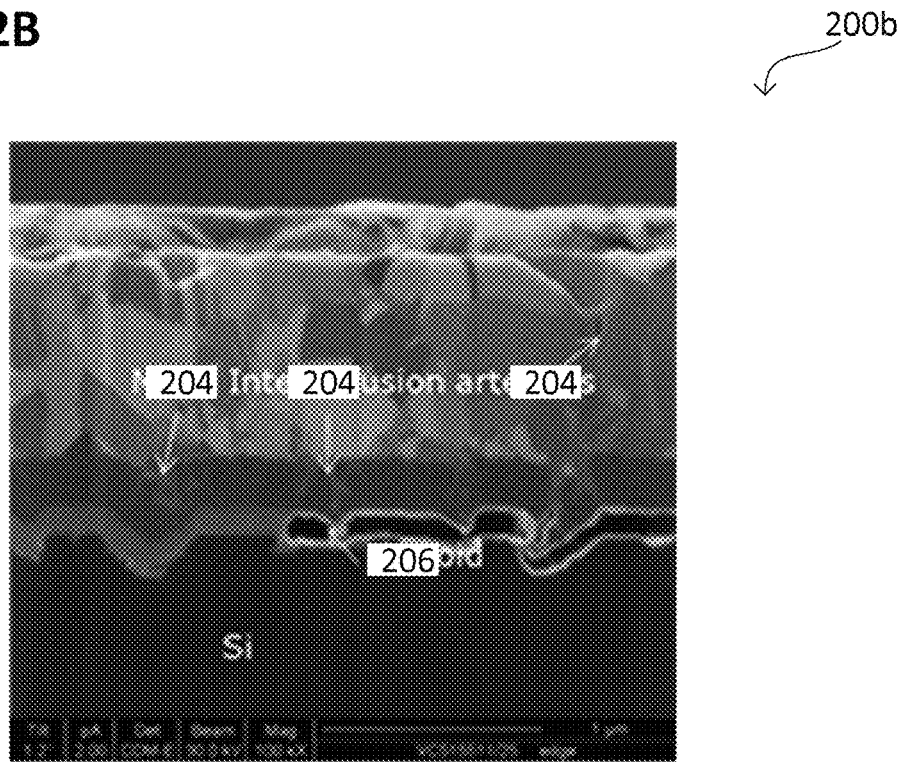
Figure 6A:
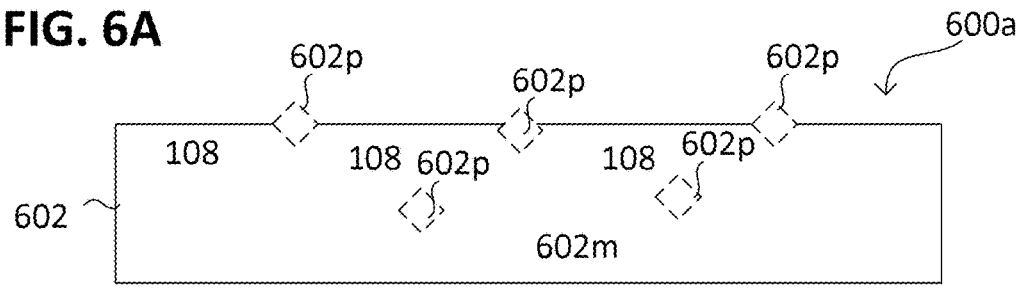
FIGS. 6A to 6D respectively show an electronic device in a method according to various embodiments.
Figure 6B:
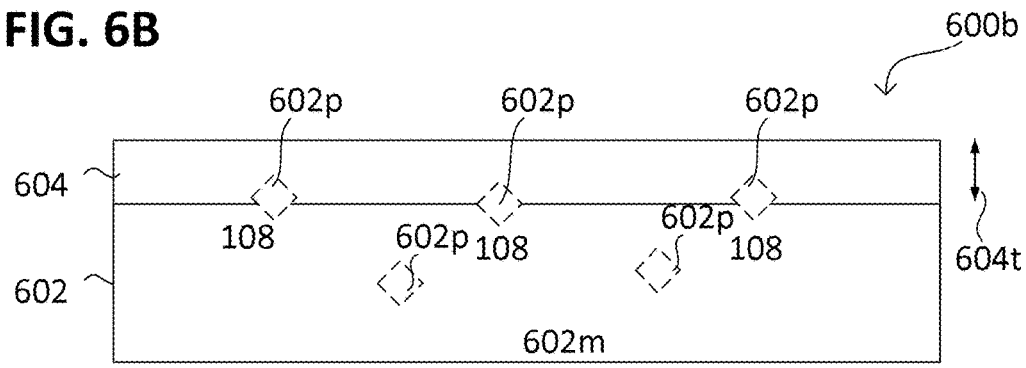
Figure 6C:
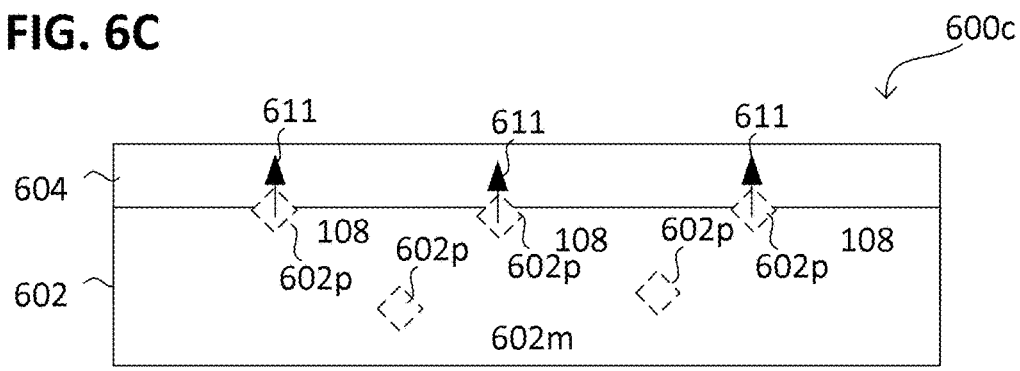
Figure 6D:
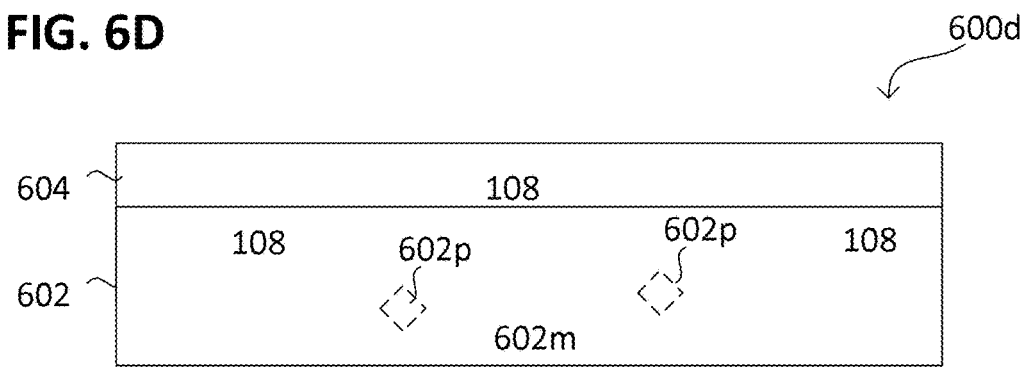
Figure 7A:
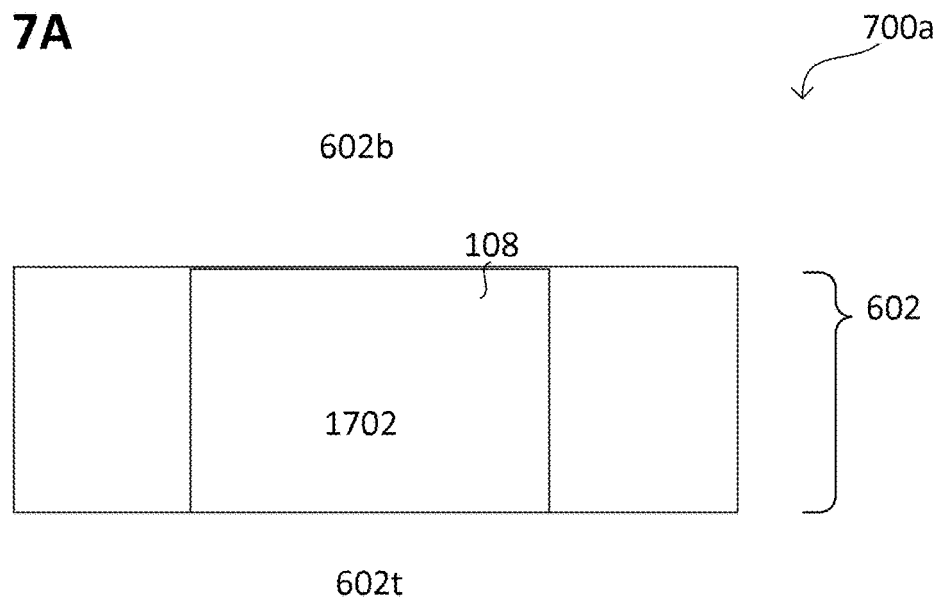
FIGS. 7A and 7B respectively show an electronic device in a method according to various embodiments.
Figure 7B:
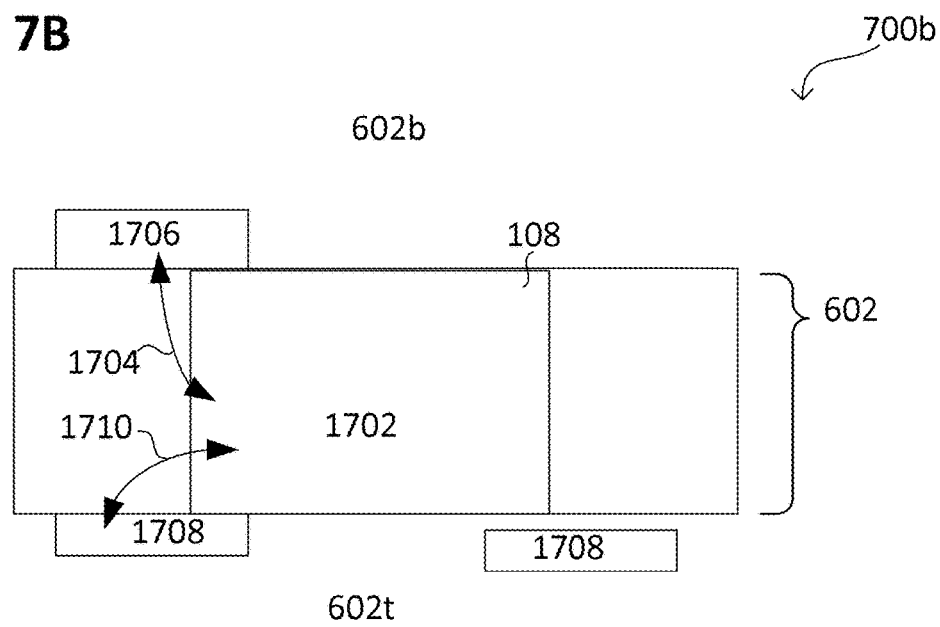
Figure 8A:
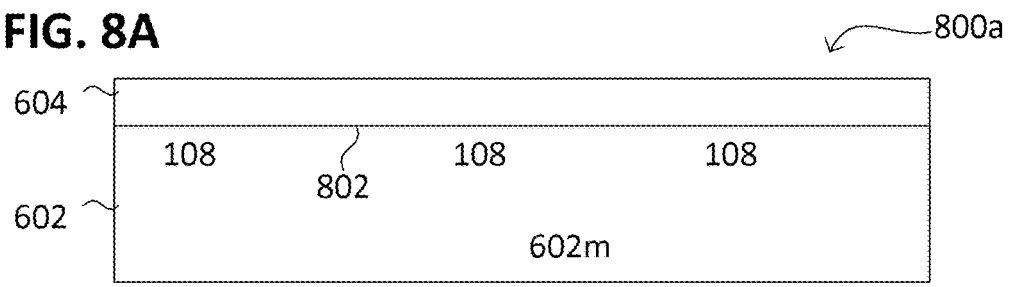
FIGS. 8A to 8D respectively show an electronic device in a method according to various embodiments.
Figure 8B:
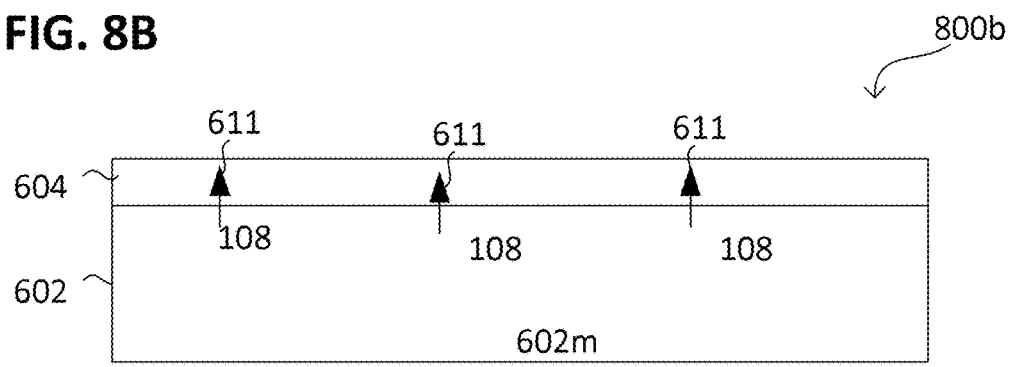
Figure 8C:
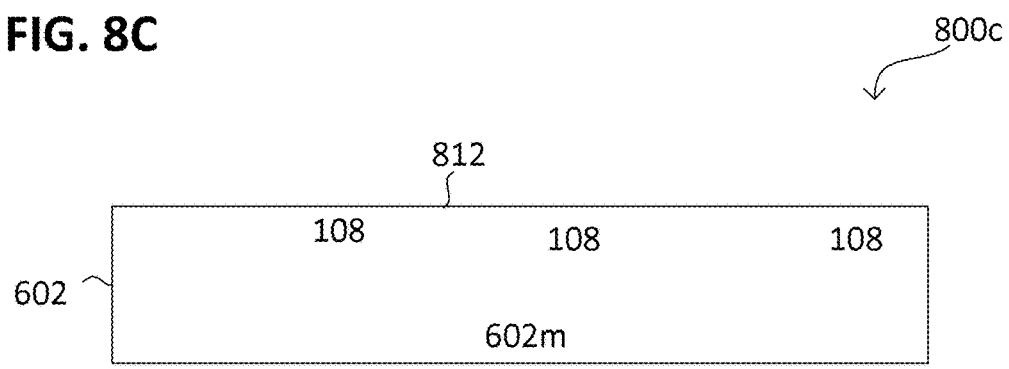
Figure 8D:
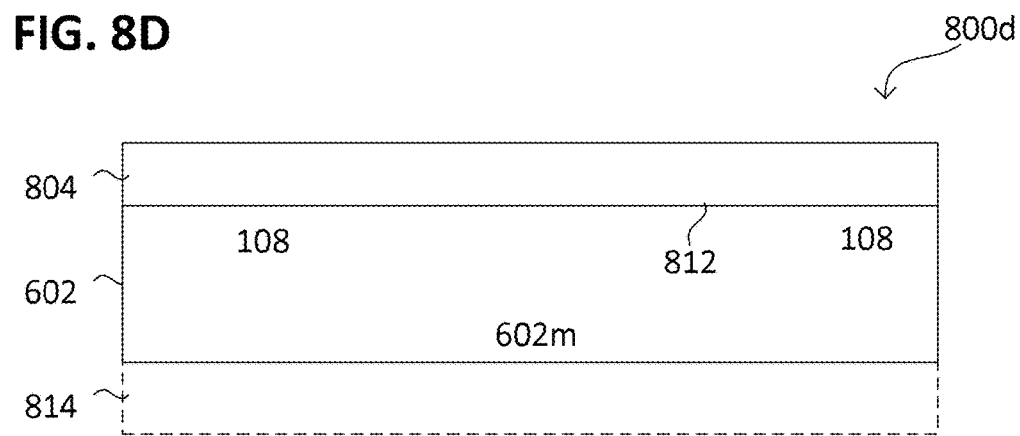
Figure 10A:
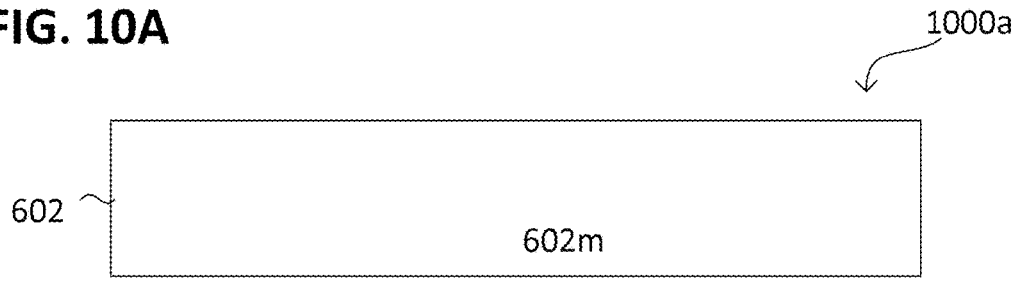
FIGS. 10A to 10D respectively show an electronic device in a method according to various embodiments.
Figure 10B:
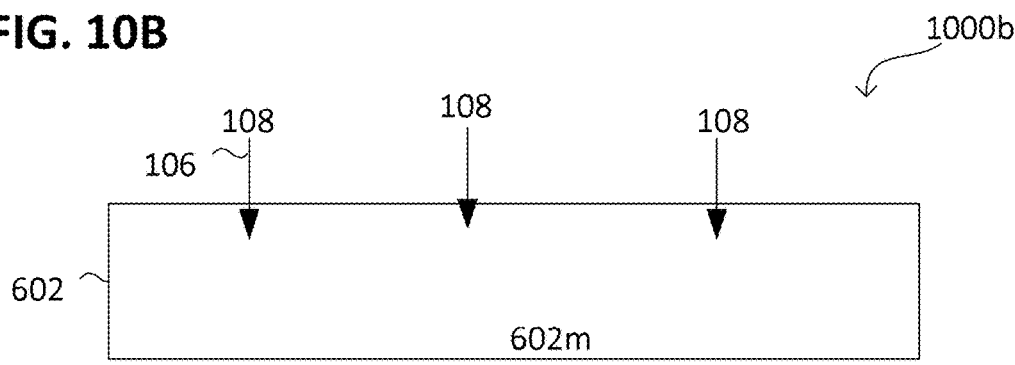
Figure 10C:
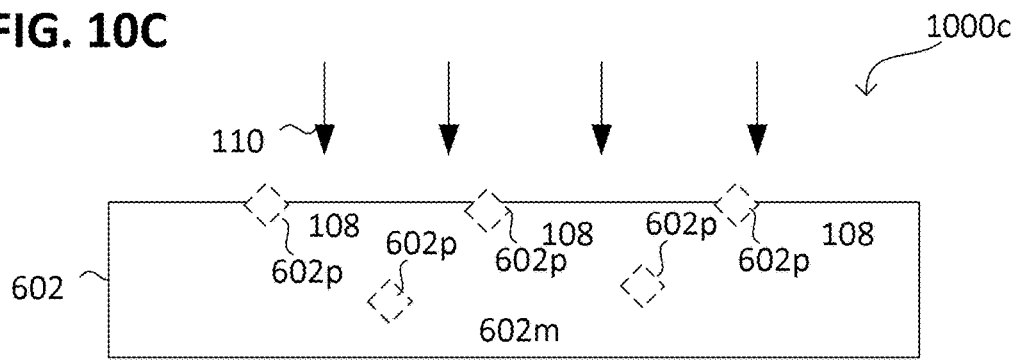
Figure 10D:
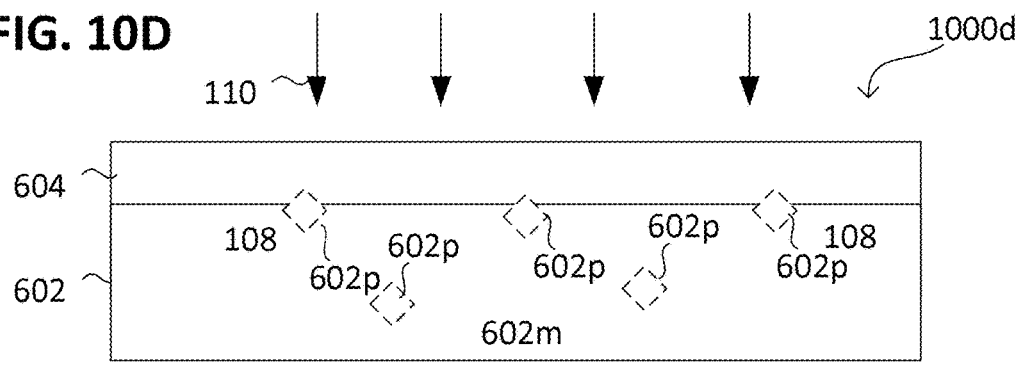

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The phrase "at least one of" in regard to a group of elements may be used herein to mean at least one element from the group consisting of the elements. For example, the phrase "at least one of" in regard to a group of elements may be used herein to mean a selection of: one of the listed elements, a plurality of one of the listed elements, a plurality of individual listed elements, or a plurality of a multiple of listed elements.

According to various embodiments, the semiconductor region may be processed to form one or more semiconductor chips (also referred to as integrated circuit or dies) at least one of in and over the semiconductor region. A semiconductor chip may include an active chip area. The active chip area may be disposed in a portion of the semiconductor region and may include one or more semiconductor circuit elements like transistors, resistors, capacitors, diodes or the like. The one or more semiconductor circuit elements may be configured to perform computing or storage operations. Alternatively or additionally, the one or more semiconductor circuit elements may be configured to perform switching or rectifying operations, e.g. in power electronics.

According to various embodiments, a semiconductor chip may be singulated from the semiconductor region by removing material from a kerf portion of the semiconductor region (also called dicing or cutting the semiconductor region). For example, removing material from the kerf portion of the semiconductor region may be processed by scribing and breaking, cleavage, blade dicing or mechanical sawing (e.g. using a dicing saw). After singulating the semiconductor chip, it may be electrically contacted and encapsulated, e.g. by mold materials and/or into a chip carrier (also called a chip housing) which may then be suitable for use in electronic devices. For example, the semiconductor chip may be bonded to a chip carrier by wires, and the chip carrier may be soldered onto a printed circuit board and/or onto a lead frame.

According to various embodiments, during semiconductor chip fabrication, various material types may be processed to form at least one of: an integrated circuit, a semiconductor circuit element, a contact pad, an electrical interconnection, such among others may be electrically insulating materials (also referred to as dielectrics), electrically semiconducting materials (also referred to as semiconductor material) or electrically conductive materials (also referred to as electrically conducting materials).

An electrically insulating material, layer, region or the like may include or be formed from a semiconductor oxide, a metal oxide, a ceramic, a semiconductor nitride, a semiconductor carbide, a glass, e.g. fluorosilicate glass (FSG), a polymer, e.g. a resin, an adhesive, a resist, benzocyclobutene (BCB) or polyimide (PI), a silicate, e.g. hafnium silicate or zirconium silicate, a transition metal oxide, e.g. hafnium dioxide or zirconium dioxide, an oxynitride, e.g. silicon oxynitride, or any other dielectric material types.

An electrically conductive material, layer, region or the like may include or may be formed from a metallic material (e.g. a metal or a metal alloy), a silicide (e.g. titanium silicide, molybdenum silicide, tantalum silicide or tungsten silicide), a conductive polymer, a polycrystalline semiconductor (e.g. polycrystalline silicon also referred to as polysilicon), or an highly doped semiconductor (e.g. highly doped silicon).

According to various embodiments, a metallic material may include or be formed from at least one chemical element of the following group of chemical elements (also referred to as metals): tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V), titanium (Ti), palladium (Pd), or zirconium (Zr) or a metal alloy including at least one chemical element of the group of chemical elements. By way of example, a metal alloy may include or be formed from at least two metals (e.g. two or more than two metals, e.g. in the case of an intermetallic compound) or at least one metal (e.g. one or more than one metal) and at least one other chemical element (e.g. a non-metal or a half metal). By way of example, a metal alloy may include or may be formed from at least one metal and at least one non-metal (e.g. carbon (C) or nitrogen (N)), e.g. in the case of steel or a nitride. By way of example, a metal alloy may include or may be formed from more than one metal (e.g. two or more metals), e.g. various compositions of gold with aluminum, various compositions of copper with aluminum, various compositions of copper and zinc (e.g. "brass") or various compositions of copper and aluminum (e.g. "aluminum bronze"), e.g. including various intermetallic compounds. A metallic material may be electrically conductive.

According to various embodiments, at least one of a substrate (also referred to as a wafer or a carrier) and a semiconductor region may include or be formed from a semiconductor material of various types, including a group IV semiconductor (e.g. silicon or germanium), a compound semiconductor, e.g. a group III-V compound semiconductor (e.g. gallium arsenide), a group II-VI compound semiconductor or other types, including group III semiconductors, group V semiconductors or polymers, for example. In an embodiment, at least one of the substrate and the semiconductor region may be made of silicon (doped or undoped), in an alternative embodiment, at least one of the substrate and the semiconductor region may be a silicon on insulator (SOI) wafer. As an alternative, any other suitable semiconductor material can be used for at least one of the substrate and the semiconductor region, for example a semiconductor compound material such as gallium phosphide (GaP), indium phosphide (InP), but also any suitable ternary semiconductor compound material or quaternary semiconductor compound material such as indium gallium arsenide (InGaAs).

A semiconductor material, layer, region or the like may be understood as having moderate electrical conductivity (also referred to as semiconducting), e.g. an electrical conductivity (measured at room temperature and constant electric field direction, e.g. constant electric field) in the range from about $10^{-6}$ Siemens per meter (S/m) to about $10^6$ S/m. An electrically conductive material (e.g. a metallic material), layer, region or the like may be understood as having high electrical conductivity (also referred to as electrical conducting), e.g. an electrical conductivity (measured at room temperature and constant electric field direction, e.g. constant electric field) greater than about $10^6$ S/m, e.g. greater than about $10^7$ S/m. An electrically insulating material, layer, region or the like may be understood as having a low electrical conductivity (also referred to as electrically insulating), e.g. an electrical conductivity (measured at room temperature and constant electric field direction, e.g. constant electric field) less than about $10^{-6}$ S/m, e.g. less than about $10^{-10}$ S/m.

The conventional planarizing process of a substrate (more generally, a semiconductor region) may be carried out by a subtractive manufacturing process, which, in some cases, may be unable to manufacture potential precipitates. According to various embodiments, a planarizing process may be enhanced by introducing a precipitate removal layer. In the following, the phrase "precipitate" may refer to various types of precipitates formed during processing the semiconductor region. For example, the precipitate may include a dopant material of the semiconductor region (in this case, the precipitate may be also referred to as dopant precipitate). The following description referring to a dopant precipitate may be more generally adapted also to other types of precipitates in the semiconductor region, such as inclusions, mixed crystals and allotrope modifications, e.g., in micrometer scale.

The precipitate removal layer may be formed over the substrate (e.g., physically contacting the potential precipitates), e.g., before or as alternative to the subtractive manufacturing process. By a thermal process, the potential precipitates may decompose into and/or be partially absorbed by the precipitate removal layer. After the thermal process, the subtractive manufacturing process may be optionally carried out, which may remove the precipitate removal layer and optionally planarize the substrate further.

According to various embodiments, a precipitate removal layer may include or be formed from at least one of tungsten (W) and titanium (Ti), for example, WTi or W. The precipitate removal layer may be disposed over a Si/$Pt_xSi_y$ grain contaminated surface (more generally precipitate contaminated surface). Subsequently, an annealing step may be applied. During the annealing step, the $Pt_xSi_y$ grains may be planarized, for example, since Pt may be distributed within the WTi or W layer.

FIG. 3 illustrates a method 300 according to various embodiments, in a schematical flow diagram. The method 300 may be configured for processing a semiconductor region, e.g., if the semiconductor region includes at least one dopant precipitate (e.g., a dopant precipitate). For example, the semiconductor region may be doped by a dopant (also referred to as dopant material).

The method 300 may include in 301 forming a precipitate removal layer over the semiconductor region. The precipitate removal layer may define an absorption temperature at which a chemical solubility of a constituent of the at least one precipitate (e.g., a dopant material from the at least one precipitate) may be greater in the precipitate removal layer than in the semiconductor region (e.g., in the at least one precipitate).

The method 300 may further include in 303 heating the precipitate removal layer above the absorption temperature.

Alternatively or additionally, the method 300 may include in 305 heating the semiconductor region above the absorption temperature.

Through the heating, the at least one precipitate may be heated above the absorption temperature. For example, the method 300 may more generally include in 307 heating the at least one precipitate above the absorption temperature. For example, the at least one precipitate may be heated via heating the precipitate removal layer. Alternatively or additionally, the at least one precipitate may be heated via heating the semiconductor region.

The method 300 may optionally include in 309 that heating at least one of the semiconductor region and the precipitate removal layer (more generally, heating the at least one precipitate) above the absorption temperature includes thermally activating absorption of the dopant from at least one precipitate in the precipitate removal layer.

The method 300 may optionally include in 311 that heating at least one of the semiconductor region and the precipitate removal layer (more generally, heating the at least one precipitate) above the absorption temperature includes activating thermally induced interdiffusion of the dopant from the semiconductor region into the precipitate removal layer.

At least one of thermally activating absorption and activating thermally induced interdiffusion may be obtained by thermally activating decomposition of the at least one precipitate.

FIG. 4 illustrates a method 400 according to various embodiments, in a schematical flow diagram. The method 400 may be configured for processing a semiconductor region. The semiconductor region may include a dopant.

The method 400 may include in 401 forming a precipitate removal layer over the semiconductor region. The precipitate removal layer may define an absorption temperature at which a chemical solubility of the dopant in the precipitate removal layer may be greater than in the semiconductor region.

The method 400 may further include in 403 thermally activating absorption (activating a thermally induced absorption) of the dopant from the semiconductor region (e.g., from at least one dopant precipitate of the semiconductor region) in the precipitate removal layer by heating above the absorption temperature (e.g., for planarizing the semiconductor region). For thermally activated absorption, a diffusion of the dopant to the precipitate removal layer may be induced thermally.

The method 400 may optionally include in 405 heating the at least one dopant precipitate via the precipitate removal layer.

The method 400 may optionally include in 407 heating the at least one dopant precipitate via the semiconductor region.

FIG. 5 illustrates a method 500 according to various embodiments, in a schematical flow diagram. The method 500 may be configured for processing a semiconductor region. The semiconductor region may include a dopant.

The method 500 may include in 501 forming a precipitate removal layer over the semiconductor region. The precipitate removal layer may define an absorption temperature at which a thermally induced absorption of the dopant in the precipitate removal layer may be greater than in at least one dopant precipitate.

The method 500 may further include in 503 heating the precipitate removal layer above the absorption temperature so as to at least partially dissolve (e.g., decompose) at least one dopant precipitate of the semiconductor region and absorb dopant material from the at least one dopant precipitate in the precipitate removal layer.

Alternatively or additionally, the method 500 may further include in 505 heating the semiconductor region above the absorption temperature so as to at least partially dissolve at least one dopant precipitate of the semiconductor region and absorb dopant material from the at least one dopant precipitate in the precipitate removal layer.

Through the heating, the at least one dopant precipitate may be heated above the absorption temperature. For example, the method 500 may more generally include in 507 heating the at least one dopant precipitate above the absorption temperature so as to at least partially dissolve at least one dopant precipitate of the semiconductor region and absorb dopant material from the at least one dopant precipitate in the precipitate removal layer. For example, the at least one dopant precipitate may be heated via heating the precipitate removal layer. Alternatively or additionally, the at least one dopant precipitate may be heated via heating the semiconductor region.

FIG. 6A to FIG. 6D respectively illustrate an electronic device in a method according to various embodiments, in a schematical side view or cross sectional view.

In 600a, the electronic device may include a semiconductor region 602. The semiconductor region 602 may include a dopant 108 (e.g., a p-dopant or n-dopant). In other words, the semiconductor region 602 may be doped (e.g., p-doped or n-doped). The dopant 108 may include or be formed from a first metal, e.g., at least one of platinum, aluminum, nickel, molybdenum, titanium and copper.

Optionally, the semiconductor region 602 may include at least one dopant precipitate 602p (also referred to as at least one potential dopant precipitate 602p). The at least one dopant precipitate 602p may be disposed at least one of in or on the semiconductor material 602m of the semiconductor region 602. For example, the semiconductor region 602 may include at least one protrusion including or formed from a dopant precipitate 602p. For example, the semiconductor region 602 may include at least one dopant precipitate 602p (one or more dopant precipitates 602p) which may be partially exposed (in other words, partially uncovered by) and from the semiconductor material 602m of the semiconductor region 602. Alternatively or additionally, the semiconductor region 602 may include at least one dopant precipitate 602p which protrudes from the semiconductor material 602m of the semiconductor region 602.

The at least one dopant precipitate 602p may include or be formed from the semiconductor material 602m of the semiconductor region 602 and the dopant 108 of the semiconductor region 602, e.g., forming a compound (e.g., a binary compound such as a silicate). The dopant may be disposed in both, the semiconductor material 602m of the semiconductor region 602 and the at least one dopant precipitate 602p. By way of example, the at least one dopant precipitate 602p may include or be formed from a silicide, e.g., at least one of platinum silicide, aluminum silicide, nickel silicide, molybdenum silicide, titan silicide and copper silicide. According to the respective semiconductor material 602m of the semiconductor region 602, other compounds including the semiconductor material 602m of the semiconductor region 602 and a metal may be formed.

The semiconductor material 602m of the semiconductor region 602 (e.g., doped) and the at least one dopant precipitate 602p may differ in at least one of a chemical composition, a crystallographic order (e.g., nanocrystalline, polycrystalline, single crystalline, amorphous), a crystallographic orientation and a crystal structure. The at least one dopant precipitate 602p may be partially embedded in the semiconductor material 602m of the semiconductor region 602.

In 600b, the electronic device may include a precipitate removal layer 604 disposed over the semiconductor region 602. The precipitate removal layer 604 may be formed over the semiconductor region 602, e.g., by a physical vapor deposition (PVD, e.g., sputtering), electrochemical deposition (e.g., plating), and a chemical vapor deposition (CVD, e.g., plasma enhanced CVD). The precipitate removal layer 604 may include or be formed from a dopant absorption material. By way of example, the dopant absorption material may be amorphous (in other words, present in an amorphous phase).

By way of example, a thickness 604t of the precipitate removal layer 604 may be in the range from about to about 10 nanometer (nm) to about 500 nm, e.g., in the range from about to about 20 nm to about 100 nm, e.g., about 50 nm. Alternatively or additionally, the thickness 604t of the precipitate removal layer 604 may be less than an extension (parallel thereto) of the at least one dopant precipitate 602p.

The precipitate removal layer 604 (or the respective dopant absorption material) may include or be formed from at least one second metal (in other words, one or more second metals, e.g., two or more second metals) e.g., a metal alloy including the at least one second metal. The at least one second metal may be different than the first metal. For example, the precipitate removal layer 604 (or the respective dopant absorption material) may include at least two second metals (a primary second metal and a secondary second metal) differing from each other, e.g., a metal alloy including the at least two second metals.

By way of example, a primary second metal of the at least one second metal may be tungsten. Alternatively or additionally, a secondary second metal of the at least one second metal may be titanium. The precipitate removal layer 604 (or the respective dopant absorption material) may be electrically conductive.

By way of example, the precipitate removal layer 604 may include or be formed from a concentration of the primary second metal more than about 50 atomic percent (at %), more than about 75 at %, e.g., more than about 80 at %, e.g., more than or equal to about 83 at %, e.g., more than about 90 at %. Alternatively or additionally, the precipitate removal layer 604 may include or be formed from a concentration of the secondary second metal less than about 50 at %, less than about 25 at %, e.g., less than about 20 at %, e.g., less than or equal to about 17 at %, e.g., less than about 10 at %.

According to various embodiments, a chemical solubility of the dopant 108 (more generally, a constituent of the at least one dopant precipitate 602p) in the precipitate removal layer 604 may be greater (e.g., more than about 100%, more than about 200%, or more than about 500%) than in the semiconductor region. For example, the dopant 108 may be soluble in the precipitate removal layer 604 up to a first concentration of the dopant 108 in the precipitate removal layer 604 (e.g., at a reference temperature). The dopant 108 may be soluble in the semiconductor region 602 up to a second concentration of the dopant 108 in the semiconductor region 602 (e.g., at the reference temperature). The second concentration may be less than (e.g., about 100%, 75%, 50%, 25%, 10%, or about 5% of) the first concentration.

In 600b (before the heating above the absorption temperature), the precipitate removal layer 604 may be substantially free of the dopant (e.g., present by less than 1% of the first concentration). Alternatively or additionally, a concentration of the dopant 108 in the precipitate removal layer 604 may be less than (e.g., about 100%, 75%, 50%, 25%, or about 10% of) a concentration of the dopant 108 in the semiconductor region 602.

More generally, the concentration of the dopant 108 in the precipitate removal layer 604 before the heating above the absorption temperature (also referred to as as-disposed concentration) may be less than (e.g., about 100%, 75%, 50%, 25%, or about 10% of) the first concentration.

The at least one dopant precipitate 602p, if present, may be disposed between the semiconductor material 602m of the semiconductor region 602 and the precipitate removal layer 604.

In 600c, the electronic device may include a precipitate removal layer 604 including the dopant 108, e.g., in a concentration more than the as-disposed concentration. The dopant 108 may be at least partially absorbed 611 by the precipitate removal layer 604, e.g., from the at least one dopant precipitate 602p. For absorbing 611 the dopant 108, at least one of the semiconductor region 602 and the precipitate removal layer 604 (also referred to as dopant absorption layer 604) may be heated, e.g., to a temperature (also referred to as planarizing temperature) above the absorption temperature. The absorption temperature may be greater than or equal to the reference temperature. The precipitate removal layer 604 may be configured to decompose the at least one dopant precipitate 602p above the absorption temperature.

For absorbing 611 the dopant 108, at least one of the semiconductor region 602 and the precipitate removal layer 604 (also referred to as dopant absorption layer 604) may be heated to the planarizing temperature less than (e.g., about 100%, 75%, 50%, 25%, or about 10% of) a temperature at which the precipitate removal layer 604 crystallizes (also referred to as recrystallization temperature). At least one of the planarizing temperature and the recrystallization temperature may be less than (e.g., about 100%, 75%, 50% or about 25% of) a melting temperature of the precipitate removal layer 604.

The absorbing 611 the dopant 108 may include or be formed from a thermally induced absorption 611 of the dopant in the precipitate removal layer 604. Therefore, the precipitate removal layer 604 may be configured to attract the dopant 108 from the at least one dopant precipitate 602p above the absorption temperature, e.g., having an increasing attraction with increasing temperature. The absorbing 611 the dopant 108 may be thermally induced by heating at least one of the semiconductor region 602 and the precipitate removal layer 604.

According to various embodiments, the absorbing 611 the dopant 108 by the precipitate removal layer 604 may be faster than the formation of at least one dopant precipitate (in other words, a precipitate including the dopant). For example, the dopant may migrate 611 at least one of faster and in a greater amount in the precipitate removal layer 604 than in at least one dopant precipitate.

According to various embodiments, an amorphous phase may be formed or maintained by the absorption 611 of the dopant 108 in the precipitate removal layer 604. For example, the precipitate removal layer 604 may remain amorphous during the absorbing the dopant 108. In other words, the phase (also referred to as dopant absorptive phase) of the precipitate removal layer 604 and the dopant 108 may form an amorphous mixed phase. The amorphous crystallographic order of the precipitate removal layer 604 of the may avoid an adaption of the topography of the unplanarized surface 802 (also referred to as precipitate contaminated surface 802) by the precipitate removal layer 604. For example, the amorphous mixed phase may maintain (amorphous) up to at least about 1000° C., e.g., up to at least about 1500° C. In contrast thereto, the at least one dopant precipitate 602p may include or be formed from a crystalline phase, e.g., including at least one of a nanocrystalline order, a polycrystalline order and a single-crystalline order. In other words, the dopant precipitate 602p may include or be formed from one or more crystallites.

A volume fraction of the at least one dopant precipitate 602p in the electronic device in 600d may be less than (e.g., about 100%, 75%, 50%, 25%, or about 10% of) a volume fraction of the at least one dopant precipitate 602p in the electronic device in 600c (e.g., due to a reduction of at least one of: a size of the at least one dopant precipitate 602p and a number of dopant precipitates 602p). The semiconductor region 602 may be planarized through the absorbing the dopant 108 by the precipitate removal layer 604. In other words, after the absorbing the dopant 108, a roughness of the semiconductor region 602 may be less than (e.g., about 100%, 75%, 50%, 25%, or about 10% of) that before the absorbing the dopant 108. Alternatively or additionally, after the absorbing the dopant 108, a protrusion of the semiconductor region 602 may be less (e.g., having a less extension) than before the absorbing the dopant 108.

After the absorbing the dopant 108, a concentration of the dopant 108 in the semiconductor region 602 may be less than (e.g., about 100%, 75%, 50%, 25%, or about 10%) a concentration of the dopant 108 in the semiconductor region 602 before the absorbing the dopant 108. Alternatively or additionally, before the absorbing the dopant 108, a concentration of the dopant 108 in the precipitate removal layer 604 may be less than (e.g., about 100%, 75%, 50%, 25%, or about 10% of) a concentration of the dopant 108 in the precipitate removal layer 604 after the absorbing the dopant 108.

According to various embodiments, for activating the thermally induced absorption, the precipitate removal layer 604 may be heated to a temperature less than (e.g., about 100%, 75%, 50%, 25%, or about 10% of) a temperature at which the precipitate removal layer 604 crystallizes (e.g., while absorbing the dopant).

FIG. 7A to FIG. 7D respectively illustrate an electronic device in a method according to various embodiments, in a schematical side view or cross sectional view.

In 700a, the electronic device may include an electronic element 1702 (e.g., disposed in the semiconductor region 602, also referred to as integrated in the semiconductor region 602).

For example, a first precipitate removal layer 604 may be disposed at a first side 602b (also referred to as bottom side 602b) of the semiconductor region 602. Alternatively or additionally, a second precipitate removal layer 604 may be disposed at a second side 602t (also referred to as top side 602t) of the semiconductor region 602. The first side 602b of the semiconductor region 602 may be opposite the second side 602t of the semiconductor region 602.

At least one of the first precipitate removal layer 604 and the second precipitate removal layer 604 may be heated to absorb at least one constituent of potential dopant precipitates of the semiconductor region 602. For example, the precipitate removal layer 604 may be used preventive (e.g., prior to a precipitate detection). By the heating, the first side 602b of the semiconductor region 602 may be planarized. Alternatively or additionally, the second side 602t of the semiconductor region 602 may be planarized by the heating. Alternatively or additionally to heating at least one of the first precipitate removal layer 604 and the second precipitate removal layer 604, the semiconductor region 602 may be heated.

The electronic element 1702 may be formed before or after the heating the precipitate removal layer 604.

The electronic element 1702 may include or be formed from at least one semiconductor circuit element (in other words, one or more semiconductor circuit elements), e.g., at least one power semiconductor circuit element. The electronic element 1702 (e.g., the at least one semiconductor circuit element) may be formed in electrical contact 1704 to at least one of the first side 602b and the second side 602t. For example, the semiconductor circuit element may include or be formed from a transistor (e.g., an insulated-gate bipolar transistors). Alternatively or additionally, the semiconductor circuit element may include or be formed from a diode.

In 700b, the electronic device may include at least one first contact pad 1706 (e.g. at least one collector contact pad 1706) on the first side 602b formed in electrical contact with the electronic element 1702. In other words, the at least one first contact pad 1706 may be electrically connected to the electronic element 1702. Alternatively or additionally, the semiconductor device 800a may include at least one second contact pad 1708 (e.g. a source/drain contact pad 1708), in other words, one or more than one second contact pads 1708, on the second side 602t formed in electrical contact 1710 to the electronic element 1702. The more than one second contact pads 1708 may optionally include a gate contact pad, e.g. which may be formed electrically insulated from the electronic element 1702.

Forming the at least one first contact pad 1706 may include or be formed from forming a first metallization (e.g., a metal layer or metal alloy layer) on the first side 602b of the semiconductor region 602. Forming the at least one second contact pad 1708 may include or be formed from forming a second metallization on the second side 602t of the semiconductor region 602. At least one of the first metallization and the second metallization may be optionally structured to form the respective at least one contact pad 1706, 1708.

According to various embodiments, the structuring a layer (e.g., at least one of the first metallization, the precipitate removal layer 604 and the second metallization) may include or be formed from at least one of: chemical processing (e.g., at least one of wet chemical and dry chemical), electrochemical processing and mechanical processing. By way of example, the layer may be structured using photolithography and etching. Alternatively or additionally, other structuring method may be used, e.g., a lift-off process, laser ablation, and the like. For example, photolithography and the lift-off process may include forming a mask layer. In this case, structuring the layer may further include removing the mask layer. By way of example, in case of the lift-off process, the layer may be formed over the mask layer. In case of the photolithography, the mask layer may be formed over the layer. The mask layer may include or be formed from a polymer, e.g., a resist, e.g., a photosensitive resist. Alternatively or additionally, the mask layer may include or be formed from another polymer, e.g., an imide (e.g., a polyimide), a resin, an epoxy, a mold compound.

FIG. 8A to FIG. 8D respectively illustrate an electronic device in a method according to various embodiments, in a schematical side view or cross sectional view.

In 800a, the electronic device may include a semiconductor region 602. The semiconductor region 602 in 800a may be configured similar to the semiconductor region 602 in 600a.

In 800a, a precipitate removal layer 604 may be formed over the semiconductor region 604, e.g., over a surface 802 (also referred to as first surface 802 or unplanarized surface 802) of the semiconductor region 602a. The precipitate removal layer 604 in 800a may be configured similar to the precipitate removal layer 604 in 600b.

In 800b, the precipitate removal layer 604 (alternatively or additionally, the semiconductor region 602) may be heated above the absorption temperature. The heating the precipitate removal layer 604 (alternatively or additionally, the semiconductor region 602) in 800b may be configured similar to the heating in 600c. After heating, the precipitate removal layer 604 may include in 800b more dopant than the precipitate removal layer 604 in 800a.

In 800c, optionally the precipitate removal layer 604 may be removed at least partially (in other words, partially or completely). According to various embodiments, removing the precipitate removal layer 604 at least partially may include or be formed from at least one of: chemical processing (e.g., at least one of wet chemical and dry chemical), electrochemical processing and mechanical processing. By way of example, the precipitate removal layer 604 may be partially removed using photolithography and etching. Alternatively or additionally, other removing methods may be used to remove precipitate removal layer 604 partially, e.g., a lift-off process, laser ablation, and the like.

By removing the precipitate removal layer 604, a surface 812 (also referred to as second surface 812 or planarized surface 812) of the semiconductor region 602 may be exposed. A roughness of the planarized surface 812 of the semiconductor region 602 may be less than (e.g., about 100%, 75%, 50%, 25%, or about 10% of) a roughness of the unplanarized surface 802 of the semiconductor region 602.

If the precipitate removal layer 604 is not or not completely removed, at least a portion of the planarized surface 812 (e.g., the complete planarized surface 812) may be a surface of the precipitate removal layer 604. In other words, one or more portions of the planarized surface 812 may be part of the semiconductor region and one or more portions planarized surface 812 may be part of the precipitate removal layer 604.

In 800*d*, a metallization 804 (e.g., the first metallization or the second metallization) may be formed over the semiconductor region 602 (in other words, over the planarized surface 812 of the semiconductor region 602), e.g., after the optional removing the precipitate removal layer 604. Optionally, the metallization 804 may be structured to form a contact pad (e.g., the at least one first contact pad 1706 or the at least one second contact pad 1708).

Alternatively or additionally, a further metallization 814 may be formed over the semiconductor region 602, e.g., at a side of the semiconductor region 602 opposite the planarized surface 812. Optionally, the further metallization 814 may be structured to form a contact pad (e.g., the at least one first contact pad 1706 or the at least one second contact pad 1708). Optionally, the side of the semiconductor region 602 opposite the planarized surface 812 may be planarized using a further precipitate removal layer 604, e.g., before forming the further metallization 814.

Illustratively, one or more sides of the semiconductor region 602 may be planarized using the precipitate removal layer 604. For example, at least one side of the semiconductor region 602 may be not processed using the precipitate removal layer 604. Alternatively, more than one side of the semiconductor region 602 (e.g., opposite sides) may be planarized using a respective precipitate removal layer 604.

If the semiconductor region 602 includes an electronic element 1702, at least one of the metallization 804 and the further metallization 814 may be electrically connected to the electronic element 1702 of the semiconductor region 604.

At least one of the metallization 804 and the further metallization 814 may include or be formed from a metallic material (e.g., different from each other). For example, the at least one of the metallization 804 and the further metallization 814 may include or be formed from at least one of zinc, nickel, aluminum, silicon and copper. For example, the at least one of the metallization 804 and the further metallization 814 may include or be formed from aluminium bronze (optionally including silicon). For example, the at least one of the metallization 804 and the further metallization 814 may include or be formed from at least one of nickel (e.g., in a composition with phosphorous) and zinc.

At least one of the metallization 804 and the further metallization 814 may include or be formed from more than one sub-layers (e.g., metal alloy layers and/or metal layers) differing in its chemical composition, e.g., at least first one sub-layer including or formed from aluminum and at least one second sub-layers including or formed from zinc.

According to various embodiments, a metallic material (e.g., for forming at least one of the metallization 804 and the further metallization 814) may be disposed over the semiconductor region 602, e.g., by a physical vapor deposition (PVD, e.g., sputtering), electrochemical deposition (e.g., plating), electroless chemical deposition (e.g., electroless plating), and a chemical vapor deposition (CVD, e.g., plasma enhanced CVD).

FIG. 9A to FIG. 9D respectively illustrate an electronic device in a method according to various embodiments, in a schematical side view or cross sectional view.

In 900*a*, the electronic device may include a semiconductor region 602. The semiconductor region 602 in 900*a* may be configured similar to the semiconductor region 602 in 600*a*.

In 900*a*, a precipitate removal layer 604 may be formed over the semiconductor region 604, e.g., over a surface 802 (also referred to as first surface 802 or unplanarized surface 802) of the semiconductor region 602*a*. The precipitate removal layer 604 in 900*b* may be configured similar to the precipitate removal layer 604 in 600*b*.

In 900*b*, the precipitate removal layer 604 (alternatively or additionally, the semiconductor region 602) may be heated above the absorption temperature. The heating the precipitate removal layer 604 (alternatively or additionally, the semiconductor region 602) in 900*b* may be configured similar to the heating in 600*c*. After heating, the precipitate removal layer 604 in 900*b* may include more dopant than the precipitate removal layer 604 in 900*a*.

By heating the precipitate removal layer 604, a surface 802 (also referred to as first surface 802 or unplanarized surface 802) of the precipitate removal layer 604 may be flattened (in other words, its roughness may be decreased), thereby forming a further surface 812 (also referred to as second surface 812 or planarized surface 812) of the precipitate removal layer. A roughness of the planarized surface 812 of the precipitate removal layer 604 (after heating) may be less than (e.g., about 100%, 75%, 50%, 25%, or about 10% of) a roughness of the unplanarized surface 802 of the semiconductor region 602 (before heating).

In 900*c*, a metallization 804 (e.g., the first metallization) may be formed over the precipitate removal layer 604, e.g., after heating (in other words, over the planarized surface 812 of the precipitate removal layer 604). Optionally, the metallization 804 may be structured to form a contact pad (e.g., the at least one first contact pad 1706 or the at least one second contact pad 1708).

In 900*d*, alternatively or additionally to the metallization 804, a further metallization 814 (e.g., the second metallization) may be formed over the semiconductor region 602, e.g., at a side of the semiconductor region 602 opposite the precipitate removal layer 604. Optionally, the further metallization 814 may be structured to form a contact pad (e.g., the at least one first contact pad 1706 or the at least one second contact pad 1708).

Optionally, a further precipitate removal layer 604 may be used to planarize the side of the semiconductor region 602 opposite the metallization 804, e.g., before forming the further metallization 814.

If the semiconductor region 602 includes an electronic element 1702, at least one of the metallization 804 and the further metallization 814 may be electrically connected to the electronic element 1702 of the semiconductor region 604, e.g., via a respective precipitate removal layer 604 disposed therebetween. For example, the electronic element 1702 may be electrically connected the metallization 804 via the precipitate removal layer 604. In this case, the precipitate removal layer 604 may be electrically conductive. For example, the precipitate removal layer 604 may include or be formed from a metallic material.

At least one of the metallization 804 and the further metallization 814 in 900*d* may be configured similar to the respective metallization in 800*d*. At least one of the metallization 804 and the further metallization 814 may include or be formed from more than one sub-layers (e.g., metal alloy layers and/or metal layers) differing in its chemical composition, e.g., at least first one sub-layer including or formed from aluminum and at least one second sub-layers including or formed from zinc.

FIG. 10A to FIG. 10D respectively illustrate an electronic device in a method according to various embodiments, in a schematical side view or cross sectional view.

In 1000*a*, the electronic device may include a semiconductor region 602. The semiconductor region 602 may include or be formed from a semiconductor material 602*m* (e.g., silicon or silicon carbide).

In 1000b, the dopant 108 may be disposed 106 in the semiconductor region 602. Disposing 106 the dopant 108 in the semiconductor region 602 may include in 100b transferring the dopant 108 into the semiconductor region 602, e.g. by ion beam implantation. In other words, the dopant may be implanted into the semiconductor region 602 by ion beam implantation. For implanting the dopant 108, the semiconductor region 602 may be irradiated with an ion beam including ions of the dopant 108. Alternatively or additionally, the dopant 108 may be provided by a gas (also referred to as dopant source gas) including the dopant 108, wherein the dopant 108 may be released from the gas and diffuses into the semiconductor region 602. Alternatively or additionally, the dopant may be provided via a dopant source layer including the dopant, wherein the dopant source layer may be heated to migrate the dopant from the dopant source layer and in the semiconductor region 602 (see for example, FIG. 11A to FIG. 11C).

By way of example, the dopant source gas may include or be formed from the dopant 108. For example, the dopant 108 may be evaporated to form the dopant source gas.

In 1000c, the semiconductor region 602 including the dopant 108 may be heated 110, e.g., for at least one of activating the dopant 108 and distributing the dopant 108 through the semiconductor region 602. For example, the semiconductor region 602 may be heated 110 at least partially by irradiating the semiconductor region 602 with optical radiation 110 or by transferring thermal energy 110 (via heat radiation) to the semiconductor region 602 using a furnace (also referred to as tempering).

By activating the dopant 108, the dopant 108 may be incorporated into the semiconductor region 102, e.g. in a lattice structure of the semiconductor region 102, to provide the activated dopant. Alternatively or additionally, by activating the dopant 108 the dopant 108 may chemically react with the semiconductor region 102, e.g. with the material of the semiconductor region 102, to provide the activated dopant. By activating the dopant 108 at least one an electrical property of the semiconductor region 602 may be changed. For example, an electrical conductivity of the semiconductor region 602 may be increased by activating the dopant 108. Alternatively or additionally, the electron lifetime of the semiconductor region 602 (in other words, a lifetime of free electrons in the semiconductor region 602) may be decreased by activating the dopant 108.

By distributing the dopant 108 through the semiconductor region 602, a spatial distribution of the dopant 108 in the semiconductor region 602 may be homogenized. In other words, a gradient of the spatial distribution of the dopant 108 in the semiconductor region 602 may be reduced.

The semiconductor region 602 may be heated 110 at least partially to above a temperature (also referred to as doping temperature, e.g., as dopant-activation temperature or dopant-migration temperature) which induces at least one of a thermal activation and a thermal migration of the dopant 108. For example, a temperature of the semiconductor region 102 may be increased, e.g. by a temperature difference. The temperature difference may be at least about 200 Kelvin (K), e.g. at least about 400 K, e.g. at least about 600 K, e.g. at least about 800 K, e.g. at least about 1000 K, e.g. in the range from about 600 K to about 1500 K. Alternatively or additionally, the doping temperature may be more than about 400 C, e.g. at least about 600 C, e.g. at least about 800 C, e.g. at least about 1000 C, e.g. in the range from about 600 C to about 1500 C.

As a parasitic effect, during the heating 110 the semiconductor region 602, the dopant 108 may form the dopant precipitates 602p. For example, the dopant 108 may form a (e.g., crystalline) phase (also referred to as precipitate phase) with the semiconductor material 602m of the semiconductor region 602 different than the (e.g., doped) phase (also referred to as host phase) of the semiconductor material 602m of the semiconductor region 602. The precipitate phase may form at least one precipitate 602p (also referred to as dopant precipitate 602p). The at least one dopant precipitate 602p may include or be formed from at least one of inclusions and a mixed crystal. The host phase (e.g., doped by the dopant 108) and the precipitate phase may differ in at least one of a chemical composition, a crystallographic order, a crystallographic orientation and a crystal structure. For example, a concentration of the dopant in the host phase may be less than (e.g., about 100%, 75%, 50%, 25%, or about 10% of) a concentration of the dopant in the precipitate phase.

By way of example, the precipitate phase may be not fully stoichiometric and thus may act as source of the dopant 108 (e.g., for Pt diffusion) within further process steps. For or example, an atomic ratio (e.g., in at %) of the dopant 108 in the precipitate phase and the atomic ratio (e.g., in at %) of semiconductor material 602m in the precipitate phase may be different.

According to various embodiments, the dopant 108 may be configured to reduce an electron lifetime of the semiconductor region 604 (in other words, a lifetime of free electrons in the semiconductor region 604). In other words, an electron lifetime of the semiconductor region 604 before the heating 110 in 1000c may be less than (e.g., about 100%, 75%, 50%, 25%, or about 10% of) an electron lifetime of the semiconductor region 604 after the heating 110 in 1000c. Alternatively or additionally, an electron lifetime of the semiconductor region 604 after the disposing 106 the dopant 108 in the semiconductor region 602 may be less than (e.g., about 100%, 75%, 50%, 25%, or about 10% of) an electron lifetime of the semiconductor region 604 before the disposing 106 the dopant 108 in the semiconductor region 602.

In various embodiments, the dopant 108 may serve as an electron lifetime killer. According to various embodiments, the electron lifetime killer may be configured to reduce switching losses of the electronic device. Illustratively, the electron lifetime killer may reduce the life time of an electric leakage current.

In 1000d, the precipitate removal layer 604 may be disposed over the semiconductor region 602. Further, the at least one dopant precipitate 602p may be heated 110 to migrate the dopant 108 from the at least one dopant precipitate 602p to the precipitate removal layer 604. In this process, the at least one dopant precipitate 602p (e.g., the precipitate phase) may be decomposed. Therefore, the at least one dopant precipitate 602p may be heated 110 above the absorption temperature. Alternatively or additionally, the at least one dopant precipitate 602p may be heated 110 below the doping temperature.

Figure 11A:
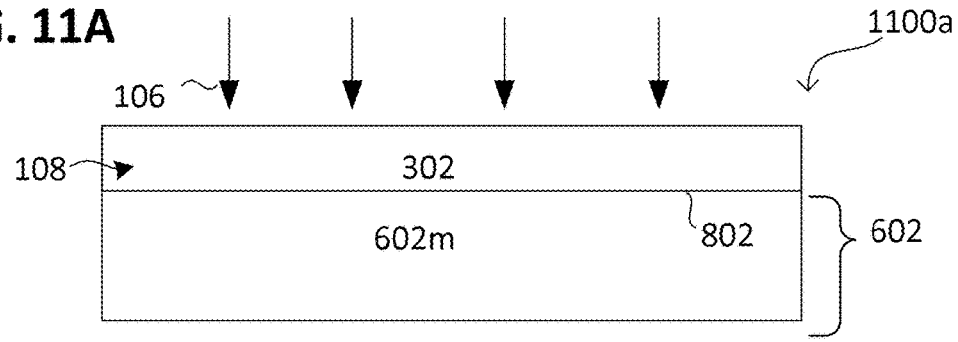
FIGS. 11A to 11D respectively show an electronic device in a method according to various embodiments.
Figure 11B:
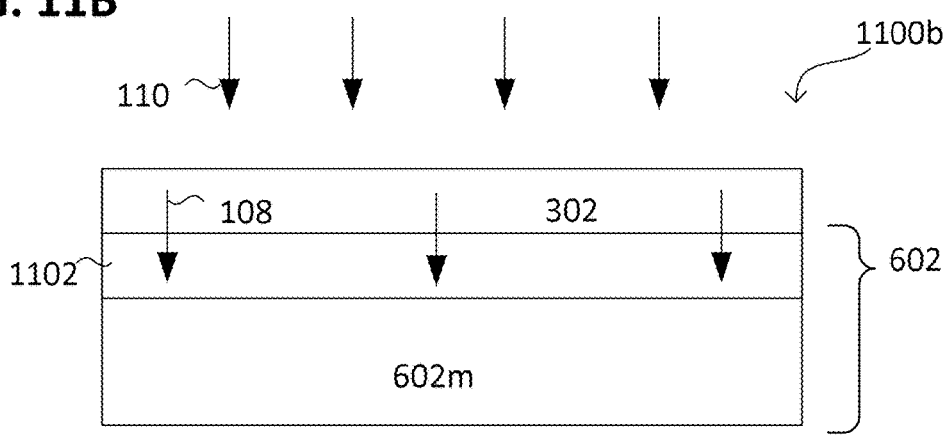
Figure 11C:
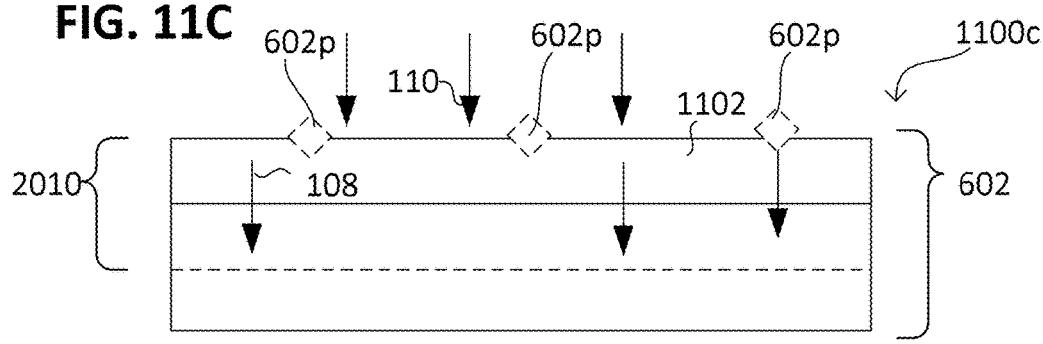
Figure 11D:
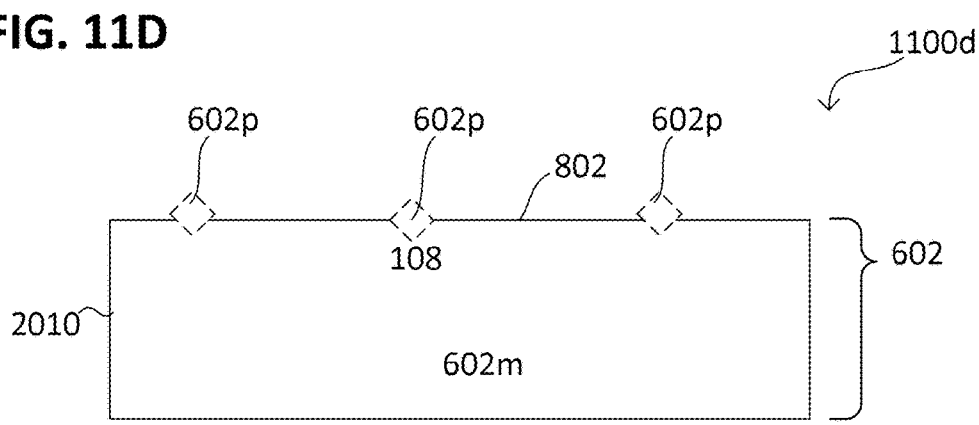

FIG. 11A to FIG. 11C respectively illustrate an electronic device in a method according to various embodiments, in a schematical side view or cross sectional view.

In 1100a, the dopant 108 may be disposed 106 over the semiconductor region 602. Disposing 106 the dopant 108 over the semiconductor region 602 may include forming a dopant source layer 302 over the semiconductor region 602, e.g. over the unplanarized surface 802 of the semiconductor region 602. The dopant source layer 302 may be formed using at least one of: physical vapor deposition, chemical vapor deposition, electrochemical deposition (e.g., plating), and fluid deposition (e.g. spin coating). For example, forming the dopant source layer 302 may include evaporating the dopant 108 to provide a dopant source gas, and depositing the dopant 108 from the dopant source gas over the semiconductor region 602. The dopant source layer 302 may include or be formed from the dopant 108.

In 1100b, the dopant 108 may be disposed in the semiconductor region 602. Disposing the dopant 108 in the semiconductor region 602 may include transferring the dopant 108 into the semiconductor region 602, e.g. from the dopant source layer 302. The dopant source layer 302, e.g. the dopant source material, may be configured to provide the dopant 108, e.g. by heating 110 the dopant source layer 302. The dopant source layer 302 may be heated 110 by at least one of: irradiation with optical radiation 110 or tempering 110, e.g., in a first heating step. The dopant 108 provided by the dopant source layer 302 may migrate (e.g. by chemical reaction and/or diffusion) into the semiconductor region 602, e.g. forming a doped semiconductor layer 1102 (e.g., as interim layer 1102). The interim layer 1102 may include or be formed from the dopant 108 and the semiconductor material 602m of the semiconductor region 602 (e.g., silicon and platinum). The interim layer 1102 may include or be formed from a similar chemical composition as the at least one dopant precipitate described before.

In the first heating step in 1100b, the dopant source layer 302 may be heated 110 to a temperature (also referred to as first doping temperature) in the range from about 200° C. to about 800° C., e.g., in the range from about 400° C. to about 500° C., e.g., about 470° C.

In 1100c, the remaining dopant (in other words, the dopant which remains outside the semiconductor region 602) may be removed, e.g., together with the dopant source layer 302.

The removing the remaining dopant, e.g., together with the dopant source layer 302, may be configured to stop at the semiconductor region 602. For example, the removing remaining dopant, e.g., together with the dopant source layer 302, may include or be formed from at least one of: chemical processing (e.g., at least one of wet chemical and dry chemical), electrochemical processing and mechanical processing. By way of example, the wet chemical processing may include or be formed from using aqua regia as etching agent.

In 1100c, a spatial distribution of the dopant 108 in the semiconductor region 602 may be increased, e.g., in a second heating step. In other words, the dopant 108 may be driven into the semiconductor region 602 (also referred to as "drive in"). By increasing the spatial distribution of the dopant 108, a gradient in a dopant 108 concentration in the semiconductor region 602 may be reduced.

In the second heating step, the interim layer 1102 (e.g., the whole semiconductor region 602) may be heated 110 to a temperature (also referred to as second doping temperature) above the first doping temperature, e.g., in the range from about 500° C. to about 1200° C., e.g., in the range from about 700° C. to about 1000° C., e.g., in the range from about 770° C. to about 910° C. By increasing the spatial distribution of the dopant 108, a thickness of the interim layer 1102 may be increased, e.g., thereby providing a doped portion 2010 of semiconductor region 602 (also referred to as doped semiconductor portion 2010).

Optionally, by heating 110 the interim layer 1102, the dopant 108 may be activated simultaneously. In other words, during spatially distributing the dopant 108 into the semiconductor region 602, the dopant 108 may be activated at least partially.

By way of example, the doped semiconductor portion 2010 may be formed thicker than the interim layer 1102. For example, the doped portion 2010 of semiconductor region 602 may be a further doped semiconductor layer 2010. Alternatively, the doped semiconductor portion 2010 may extend through the semiconductor region 602 (e.g., from the first side of the semiconductor region 602 to the second side of the semiconductor region 602).

An electron lifetime of the semiconductor region 604 in the doped semiconductor portion 2010 may be less than (e.g., about 100%, 75%, 50%, 25%, or about 10% of) that outside or prior to forming the doped semiconductor portion 2010 (e.g., in the semiconductor material 602m of the semiconductor region 602, doped or undoped).

According to various embodiments, the dopant may be distributed (migrated) through the (complete) semiconductor region 602. An electron lifetime of the semiconductor region 604 after disposing 106 the dopant 108 may be less than that before the disposing 106 the dopant 108.

In 1100c (e.g., as a parasitic effect), during the heating 110 the interim layer 1102, the at least one dopant precipitate 602p may be formed. For example, the dopant 108 may form the precipitate phase with the semiconductor material 602m of the semiconductor region 602 different than the host phase (e.g., including the semiconductor material 602m of the semiconductor region 602 and the dopant 108). For example, a concentration of the dopant in the host phase may be less than (e.g., about 100%, 75%, 50%, 25%, or about 10% of) a concentration of the dopant in the precipitate phase.

The at least one dopant precipitate 602p may be stable against the distributing the dopant. In other words, a resistance (e.g., at least one of a chemical resistivity and a mechanical resistivity) of the at least one dopant precipitate 602p against the distributing may be greater than a resistance (e.g., at least one of a chemical resistivity and a mechanical resistivity) of the semiconductor material 602m of the semiconductor region 602 against the distributing.

As result, at least one dopant precipitate 602p (e.g., $Pt_xSi_y$ grains) may protrude out of the semiconductor material 602m of the semiconductor region 602 (e.g., the Si surface) in 1100d (in other words, the unplanarized surface 802 of the semiconductor region 602 may be formed). The at least one dopant precipitate 602p may be very hard and thus very hard to planarize.

In a further process, the precipitate removal layer 604 may be used to planarize the semiconductor region 602, as described herein.

Figure 12A:
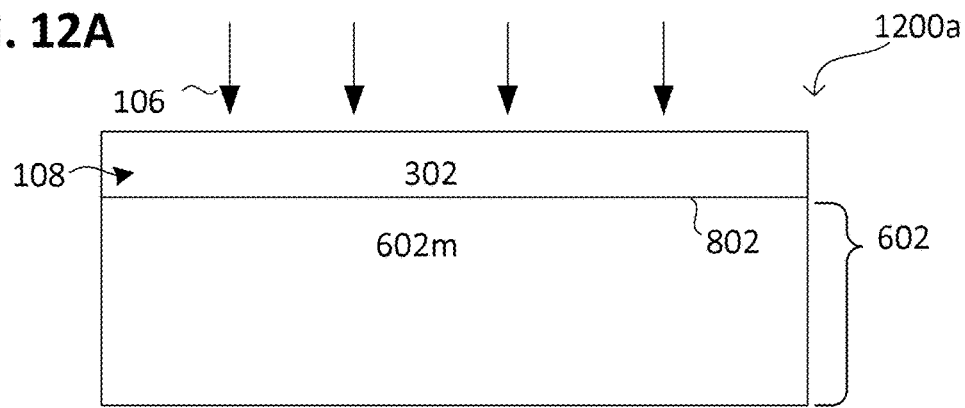
FIGS. 12A to 12C respectively show an electronic device in a method according to various embodiments.
Figure 12B:
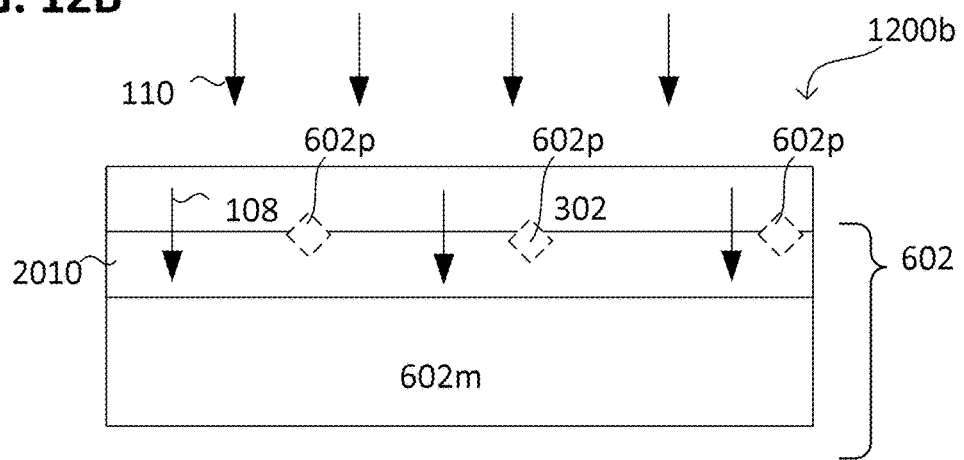
Figure 12C:
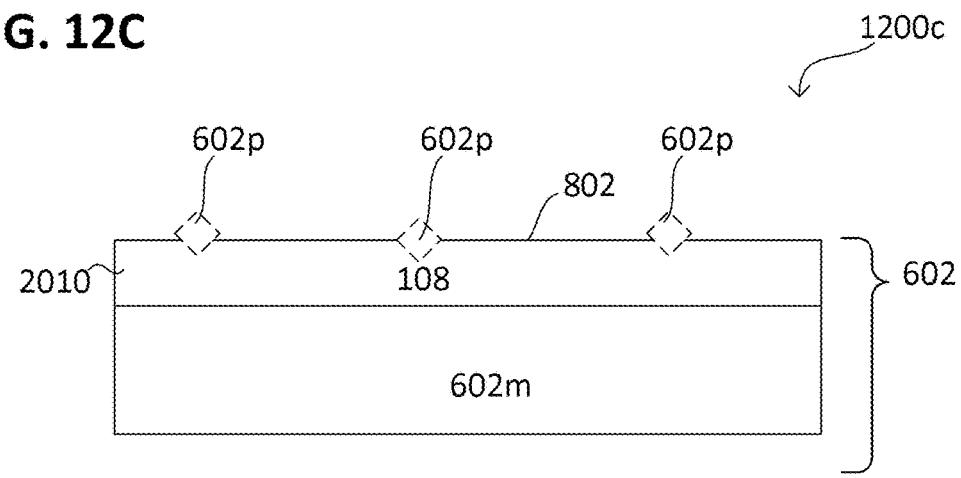

FIG. 12A to FIG. 12C respectively illustrate an electronic device in a method according to various embodiments, in a schematical side view or cross sectional view.

In 1200a, the dopant may be disposed over the semiconductor region 602, e.g., as described before. Disposing the dopant over the semiconductor region 602 may include forming a dopant source layer 302 over the semiconductor region 602, e.g. over the unplanarized surface 802 of the semiconductor region 602. The dopant source layer 302 may be formed using at least one of: physical vapor deposition, chemical vapor deposition, electrochemical deposition (e.g., plating), and fluid deposition (e.g. spin coating).

The dopant source layer 302 may include the dopant 108, e.g. at least one of disposed in or as part of a material of the dopant source layer 602 (also referred to as dopant source material), e.g. chemically bonded in the dopant source material.

In 1200b, the dopant 108 may be disposed in the semiconductor region 602. Disposing the dopant 108 in the semiconductor region 602 may include transferring the dopant 108 into the semiconductor region 602, e.g. from the dopant source layer 302. The dopant source layer 302, e.g. the dopant source material, may be configured to provide the dopant 108, e.g. by heating 110 the dopant source layer 302. The dopant source layer 302 may be heated 110 by at least one of: irradiation with electromagnetic radiation 110 or tempering. The dopant 108 provided by the dopant source layer 302 may migrate (e.g. by chemical reaction and/or diffusion) into the semiconductor region 602, e.g. forming a doped semiconductor portion 2010 of the semiconductor region 602. By way of example, an electron lifetime of the semiconductor region 604 in the doped semiconductor portion 2010 may be less than (e.g., about 100%, 75%, 50%, 25%, or about 10% of) that outside the doped semiconductor portion 2010 (e.g., in the semiconductor material 602m of the semiconductor region 602, doped or undoped).

Optionally, by heating 110 the dopant source layer 302 (e.g., with electromagnetic radiation 110), the dopant 108 may be activated simultaneously. In other words, during transferring the dopant 108 into the semiconductor region 602, the dopant 108 may be activated at least partially.

As a parasitic effect, during the heating 110 the dopant source layer 302, the dopant 108 may form the at least one dopant precipitate 602p. For example, the dopant 108 may form the precipitate phase with the semiconductor material 602m of the semiconductor region 602 different than the host phase. For example, a concentration of the dopant in the host phase may be less than (e.g., about 100%, 75%, 50%, 25%, or about 10% of) a concentration of the dopant in the precipitate phase.

In 1200c, the remaining dopant (in other words, the dopant which remains outside the semiconductor region 602) may be removed, e.g., together with the dopant source layer 302.

The removing the remaining dopant, e.g., together with the dopant source layer 302, may be configured to stop at the semiconductor region 602. For example, removing remaining dopant, e.g., together with the dopant source layer 302, may include or be formed from at least one of: chemical processing (e.g., at least one of wet chemical and dry chemical), electrochemical processing and mechanical processing. By way of example, the wet chemical processing may include or be formed from using aqua regia.

The at least one dopant precipitate 602p may be stable against the removing (more generally, against an at least one of chemical and mechanical subtractive manufacturing) the remaining dopant. In other words, a resistance (e.g., at least one of a chemical resistivity and a mechanical resistivity) of the at least one dopant precipitate 602p against the removing may be greater than a resistance (e.g., at least one of a chemical resistivity and a mechanical resistivity) of the semiconductor material 602m of the semiconductor region 602 (e.g., being doped) against the removing (more generally, against an at least one of chemical and mechanical subtractive manufacturing). By way of example, a mechanical hardness of the semiconductor material 602m of the semiconductor region 602 may be less than (e.g., about 100%, 75%, 50%, 25%, or about 10% of) a mechanical hardness of the at least one dopant precipitate 602p. For example, the chemical resistivity of the at least one dopant precipitate 602p may be provided by an oxide passivation covering the at least one dopant precipitate 602p. For example, the at least one dopant precipitate 602p may resist aqua regia.

Therefore, by removing the remaining dopant 108, the at least one dopant precipitate 602p may be exposed. Further, the unplanarized surface 802 of the semiconductor region 602 may be exposed. The at least one dopant precipitate 602p may protrude from the semiconductor material 602m of the semiconductor region 602.

Further, the precipitate removal layer 604 may be used to planarize the semiconductor region 602, as described herein.

Figure 13:
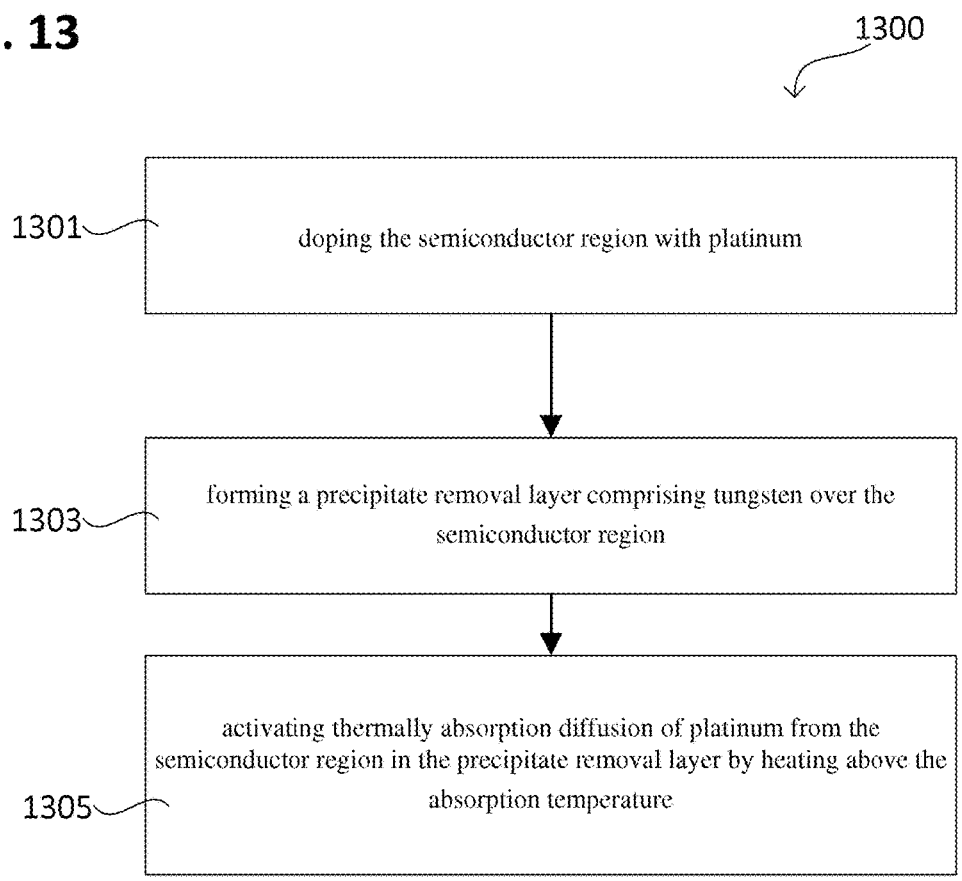
FIGS. 13 and 14 respectively show a method according to various embodiments.

FIG. 13 respectively illustrate a method 1300 according to various embodiments, in a schematical flow diagram. The method 1300 may be configured for processing a semiconductor region.

The method 1300 may include in 1301 doping the semiconductor region with platinum. Doping may include disposing the platinum in the semiconductor region. Optionally, doping may include at least one of activating the platinum and distributing the platinum by migration.

The method 1300 may further include in 1303 forming a precipitate removal layer comprising tungsten over the semiconductor region. The precipitate removal layer may define an absorption temperature at which a chemical solubility of platinum in the precipitate removal layer may be greater than in the semiconductor region.

The method 1300 may further include in 1305 thermally activating absorption (activating a thermally induced absorption) of platinum from the semiconductor region (e.g., from platinum precipitates of the semiconductor region) in the precipitate removal layer by heating above the absorption temperature (e.g., for planarizing the semiconductor region). For example, the at least one dopant precipitate may be heated via heating the precipitate removal layer. Alternatively or additionally, the at least one dopant precipitate may be heated via heating the semiconductor region. For thermally induced absorption, a diffusion of the platinum to the precipitate removal layer may be induced thermally.

Figure 14:
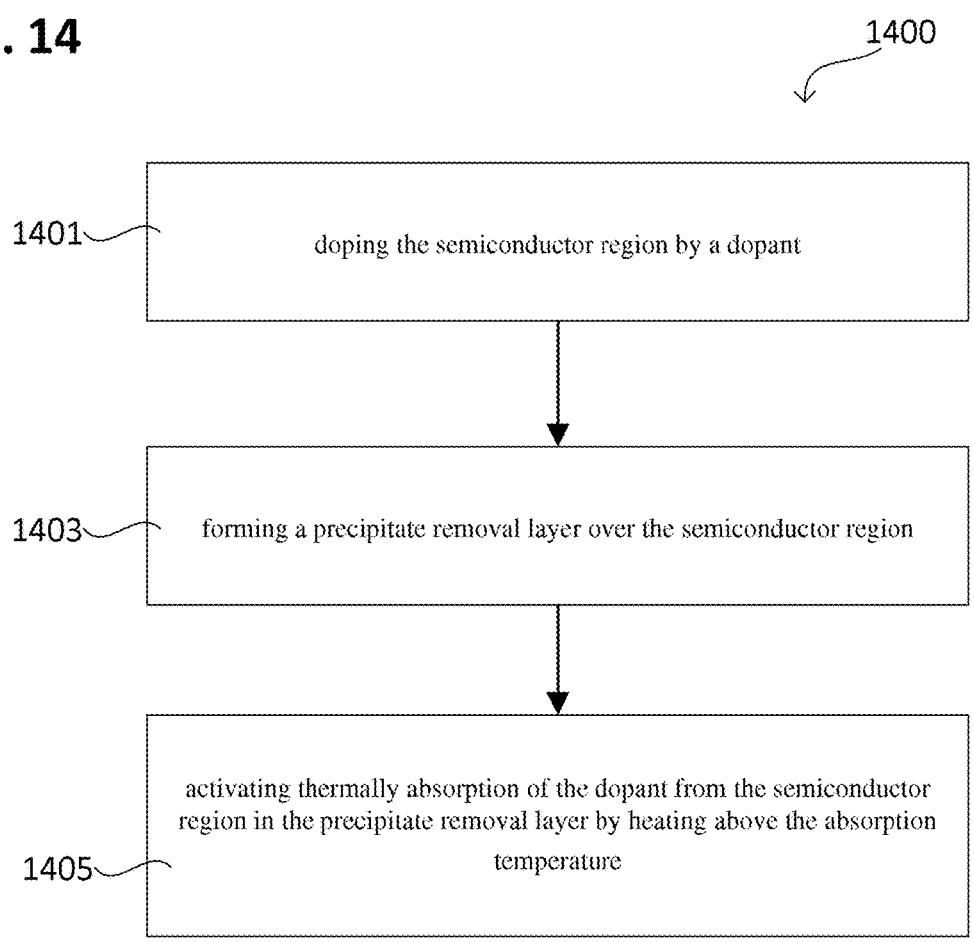

FIG. 14 respectively illustrate a method 1400 according to various embodiments, in a schematical flow diagram. The method 1400 may be configured for processing a semiconductor region.

The method 1400 may include in 1401 doping the semiconductor region by a dopant. Doping may include disposing the dopant in the semiconductor region. Optionally, doping may include at least one of activating the dopant and distributing the dopant by migration.

The method 1400 may further include in 1403 forming a precipitate removal layer over the semiconductor region. The precipitate removal layer may define an absorption temperature at which a chemical solubility of the dopant in the precipitate removal layer may be greater than in the semiconductor region.

The method 1400 may further include in 1405 thermally activating absorption (activating a thermally induced absorption) of the dopant from the semiconductor region (e.g., from at least one dopant precipitate of semiconductor region) in the precipitate removal layer by heating above the absorption temperature (e.g., for planarizing the semiconductor region).

In 1401, doping the semiconductor region may exemplarily include disposing the dopant at least one of in and over the semiconductor region; and activating a thermally induced diffusion of the dopant into or through the semiconductor region by heating the semiconductor region (e.g., above a precipitate formation temperature).

In 1401, doping the semiconductor region may exemplarily include removing remaining dopant from the semiconductor region after activating the thermally induced diffusion of the dopant into the semiconductor region.

By way of example, the at least one dopant precipitate may be formed during doping the semiconductor region in

1401. For example, each dopant precipitate may form a protrusion of the semiconductor region.

Figure 15A:
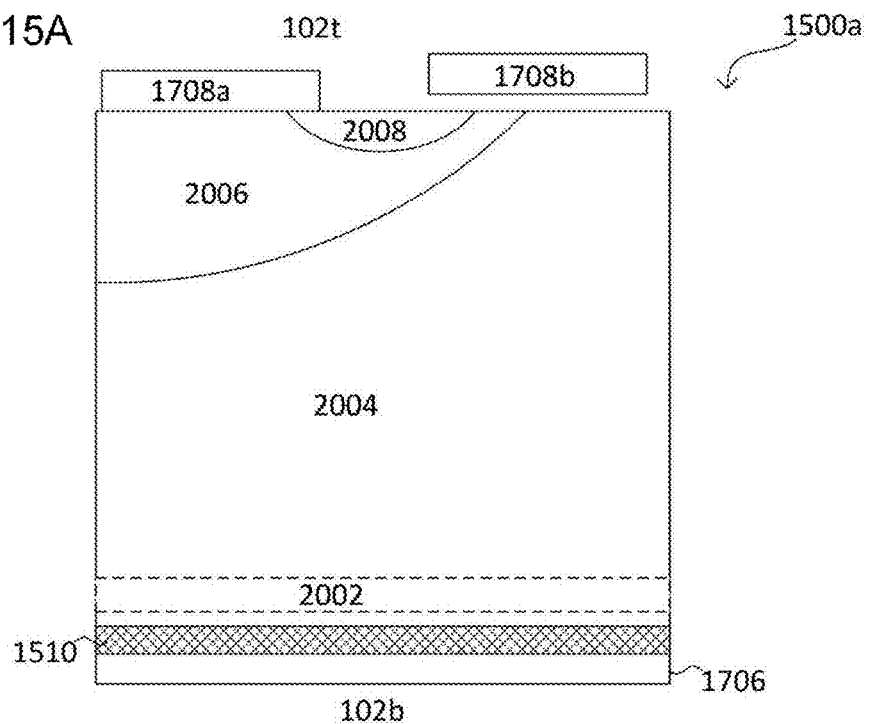
FIGS. 15A and 15B respectively show an electronic device in a method according to various embodiments.

FIG. 15A illustrates an electronic device 1500a (e.g., a semiconductor device 1500a) according to various embodiments in a method according to various embodiments in a schematic cross sectional view or side view, e.g., a semiconductor circuit element, e.g., a power semiconductor circuit element.

The electronic device 1500a may include a doped semiconductor layer 1510 formed a second side 102b of the electronic device. The doped semiconductor layer 1510 may include or be formed from a first doping type. The doped semiconductor layer 1510 may include or be formed from a collector region (an electrically conductive doped semiconductor region in form of a collector region).

The electronic device 1500a may further include a first contact pad 1706 in form of a collector contact pad 1706 (e.g., a drain contact pad). The first contact pad 1706 may electrical contact the doped semiconductor layer 1510, optionally via a precipitate removal layer 604 disposed therebetween.

Further, the electronic device 1500a may include a first doped region 2006 (first semiconductor region that is doped) formed on a first side 102t of the electronic device. The first doped region 2006 may include or be formed from a base region. The first doped region 2006 may include (e.g., a dopant having) a doping type equal to the doped semiconductor layer 1510 (in other words, the dopant of the doped semiconductor layer 1510), e.g., the first doping type. The electronic device 1500a may further include a second contact pad 1708a on the first side 102t electrical contacting the first doped region 2006, optionally via the precipitate removal layer 604 disposed therebetween. The second contact pad 1708a may include or be formed from an emitter contact pad 1708a (e.g., a source contact pad 1708a).

Further, the electronic device 1500a may include a second doped region (second semiconductor region that is doped) 2004 formed between the first doped region 2006 and the doped semiconductor layer 1510. The second doped region 2004 may include or be formed from a drift region. The second doped region 2004 may include a doping type (second doping type) different than the doped semiconductor layer 1510, e.g., a dopant having the second doping type. The second doped region 2004 may include an epitaxial formed layer (e.g., the second semiconductor region 804).

The electronic device 1500a may further include a further second contact pad 1708b on the first side 102t. The further second contact pad 1708b may include or be formed from a gate contact pad 1708b. The further second contact pad 1708b may be formed electrical insulated from the second doped region 2004, e.g., by an electrically insulating material formed therebetween (between the further second contact pad 1708b and the second doped region 2004).

Further, the electronic device 1500a may include a third doped region 2008. The third doped region 2008 may include or be formed from an emitter region. The third doped region 2008 may include (e.g., a dopant having) a doping type different than the doped semiconductor layer 1510, e.g., the second doping type. A dopant concentration of the third doped region 2008 may be greater than of the second doped region 2004.

Optionally, the electronic device 1500a may include a fourth doped region 2002 between the second doped region 2004 and the doped semiconductor layer 1510. The fourth doped region 2002 may include or be formed from a field stop region. The fourth doped region 2002 may include a dopant having a doping type different than the doped semiconductor layer 1510. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

The electronic device 1500a, e.g., a semiconductor circuit element 1702, may include or be formed from a transistor structure (e.g., in an IGBT), e.g., a planar transistor structure (providing a vertical current flow). A transistor structure may include or be formed from a plurality of unipolar junctions (e.g., p-n junctions), e.g., forming a bipolar junction. An unipolar junction may be formed by an interface of two doped regions having different doping types, e.g., an interface between at least one the following: the first doped region 2006 and the second doped region 2004; the first doped region 2006 and the third doped region 2008; the second doped region 2004 and the doped semiconductor layer 1510; the doped semiconductor layer 1510 and the fourth doped region 2002.

According to various embodiments, the second doped region 2004 and the fourth doped region 2002 may include the same doping type. As described above, the doped semiconductor layer 1510 may differ from the second doped region 2004 and the fourth doped region 2002 in the doping type. In this case, the doped semiconductor layer 1510 may provide a backside emitter region (e.g., for an IGBT). Alternatively, the doped semiconductor layer 1510 may have the same doping type as the second doped region 2004 and the fourth doped region 2002. In this case, the doped semiconductor layer 1510 may provide a contact enhancement region (e.g., for a vertical metal-oxide-semiconductor field-effect transistor).

According to various embodiments, the electronic device 1500a, e.g., the semiconductor circuit element 1702, may include or be formed from insulated-gate bipolar transistor.

Figure 15B:
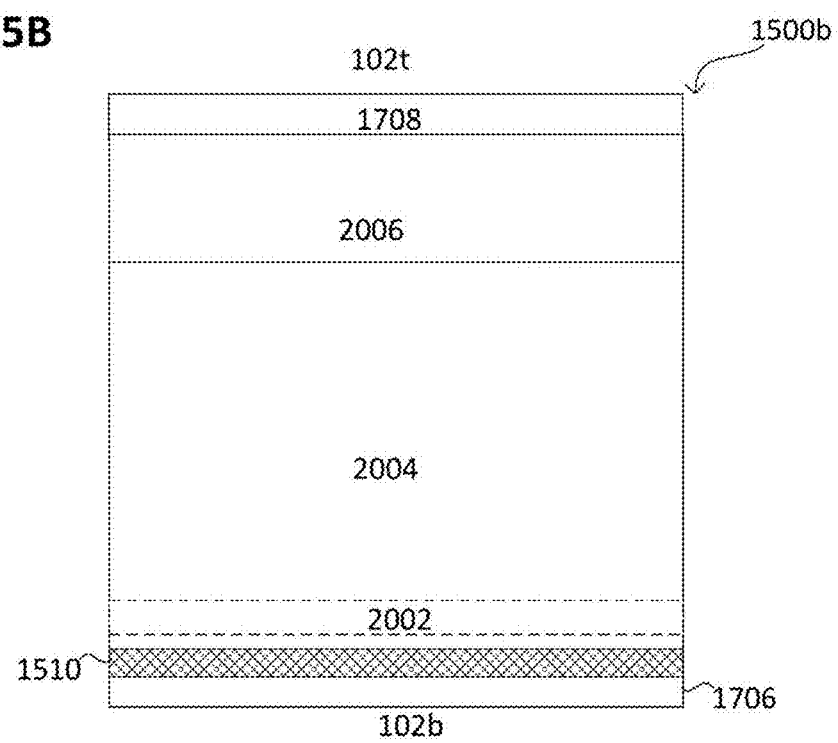
Figure 16A:
FIGS. 16A and 16B respectively show an electronic device in a method according to various embodiments.
Figure 16B:
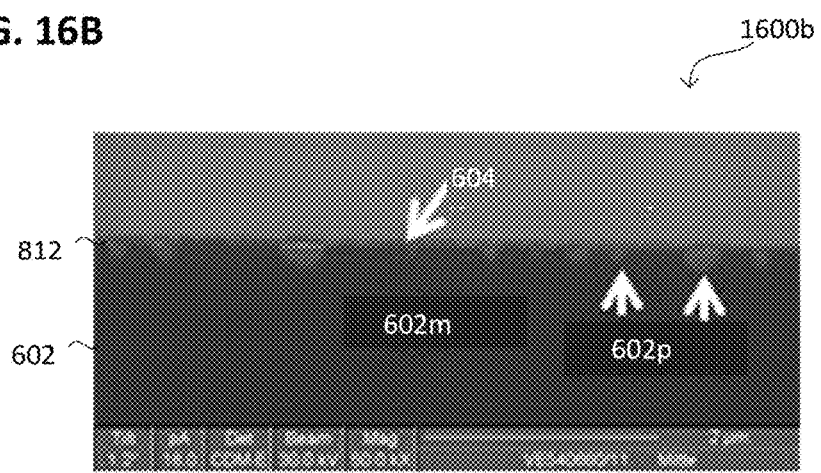

FIG. 15B illustrates an electronic device 1500b, e.g., a semiconductor device 1500b, according to various embodiments in a method according to various embodiments in a schematic cross sectional view or side view, e.g., a semiconductor circuit element, e.g., a power semiconductor circuit element.

The electronic device 1500b may include the doped semiconductor layer 1510 formed on the second side 102b. The doped semiconductor layer 1510 (in other words, the activated dopant) may include or be formed from a first doping type.

The electronic device 1500b may further include a first contact pad 1706 on the second side 102b electrically contacting the doped semiconductor layer 1510, optionally via the precipitate removal layer 604 disposed therebetween. The first contact pad 1706 may include or be formed from an electrode contact pad. Illustratively, the first doped region 2006 may provide a thin doped region and/or the second doped region 2004 may provide a thick drift zone. The first doped region 2006 may be electrically and/or physically connected with a second contact pad 1708, optionally via the precipitate removal layer 604 disposed therebetween.

Further, the electronic device 1500b may include a first doped region 2006 on the first side 102t. The first doped region 2006 may include or be formed from a first junction region. The first doped region 2006 may include a dopant having a doping type different than the doped semiconductor layer 1510 (in other words, the dopant of the doped semiconductor layer 1510), e.g., the second doping type. The electronic device 1500*b* may further include the second contact pad 1708 on the first side 102*t* electrical contacting the first doped region 2006, optionally via the precipitate removal layer 604 disposed therebetween. The second contact pad 1708 may include or be formed from an electrode contact pad. Further, the electronic device 1500*b* may include a second doped region 2004 formed between the first doped region 2006 and the doped semiconductor layer 1510. The second doped region 2004 may include or be formed from a second junction region. The second doped region 2004 may include a doping type equal to a doping type of the doped semiconductor layer 1510, e.g., a dopant having the first doping type.

Optionally, the electronic device 1500*b* may include a third doped region 2002 between the second doped region 2004 and the doped semiconductor layer 1510. The third doped region 2002 may include or be formed from a field stop region. The third doped region 2002 may include (e.g., a dopant having) a doping type equal to a doping type of the doped semiconductor layer 1510. The third doped region 2002 may include a dopant concentration higher than the second doped region 2004.

The electronic device 1500*b* may include or be formed from a diode structure, e.g., a planar diode structure (providing a vertical current flow). A diode structure may include or be formed from a unipolar-junction (e.g., a p-n junction), e.g., formed by an interface of two doped regions having different doping types, e.g., an interface between the first doped region 2006 and the second doped region 2004.

Optionally, the doped semiconductor layer 1510 may include or be formed from a plurality of first segments including the first doping type and a plurality of second segments including the second doping type. The segments of the plurality of first segments and the segments of the plurality of second segments may be disposed in an alternating order. In this case, the doped semiconductor layer 1510 may be part of backward-diode structure.

FIG. 16A to FIG. 16D respectively illustrate an electronic device in a method according to various embodiments, in a schematical side view or cross sectional view.

In 1600*a*, an unplanarized surface 802 including a semiconductor material 602*m* of the semiconductor region 602 (e.g., silicon) and at least one dopant precipitate 602*p* (e.g., Pt$_x$Si$_y$ grains) may be provided (x may differ from y). For example, a Si/Pt$_x$Si$_y$ grain surface may be provided. If a metallization (e.g., including or formed from AlSiCu) may be disposed over the unplanarized surface 802, the at least one dopant precipitate 602*p* (e.g., Pt$_x$Si$_y$ grains) may extend (illustratively, "spike") into the metallization.

In 1600*b*, a planarized surface 812 may be provided. The planarized surface 812 may be obtained by covering the unplanarized surface 802 with the precipitate removal layer 604 and decomposing the at least one dopant precipitate 602*p* using the precipitate removal layer 604, e.g., by migrating dopant 108 from the at least one dopant precipitate 602*p* into the precipitate removal layer 604. Illustratively, the at least one dopant precipitate 602*p* peaks may be leveled by the precipitate removal layer 604.

By way of example, the precipitate removal layer 604 may include or be formed from a titanium tungsten alloy. By way of example, the precipitate removal layer 604 may have a thickness of about 50 nm.

According to various embodiments, at least one of a tungsten layer 604 and a mixed material layer 604 may be provided to planarize at least one dopant precipitate 602*p* (e.g., Pt$_x$Si$_y$ grains). The mixed material layer may include tungsten (e.g., in a concentration above about 50 at %, e.g., above 75 at %, e.g., above about 90 at %) or may be formed from tungsten.

The chemical composition of the precipitate removal layer 604 may be configured such that no crystalline phases (e.g., crystalline mixed phases) are available at temperatures below about 1000° C. Alternatively or additionally, the chemical composition of the precipitate removal layer 604 may be configured such that the solid solubility of tungsten in platinum and of platinum in tungsten may be very high, e.g., above the respective solid solubility in the semiconductor material 602*m* of the semiconductor region 602. Illustratively, an interdiffusion process may be induced with increasing temperature leading to a stable outbalanced W-Pt mixed area. Beside the planarized surface 812, the Pt may be more localized (illustratively, less likely to diffuse), i.e. the dopant (e.g., Pt atoms) may be localized in the mixed area (provided by the precipitate removal layer 604). This may facilitate further processes (e.g., reduce parasitic diffusion of platinum) inducing a temperature budget on the stack-like implantation annealing or backside processes (e.g., forming a metallization).

The precipitate removal layer 604 (e.g., WTi layer) may be sputtered over the semiconductor region 602 (e.g., over the unplanarized surface 802, e.g., including Si/Pt$_x$Si$_y$ grains). Alternatively or additionally, a precipitate removal layer 604 may be formed from a maximum of one metal (e.g., tungsten), e.g., formed using CVD.

According to various embodiments, the semiconductor region 602 may be annealed for planarizing during forming the precipitate removal layer 604 (in other words, the annealing may be carried out in situ). Alternatively or additionally, the semiconductor region 602 may be annealed for planarizing during forming a metallization over the precipitate removal layer 604. Alternatively, the semiconductor region 602 may be annealed for planarizing in a separate annealing step (e.g., before or after forming the respective layers).

According to various embodiments, Pt$_x$Si$_y$ grains may be planarized and further the Pt atoms may be localized within a stable W—Pt mixed area.

Further, various embodiments will be described in the following.

According to various embodiments, a method for processing a semiconductor region, wherein the semiconductor region includes at least one precipitate, may include: forming a precipitate removal layer over the semiconductor region, wherein the precipitate removal layer may define an absorption temperature at which a chemical solubility of a constituent of the at least one precipitate may be greater in the precipitate removal layer than in the semiconductor region; and heating the at least one precipitate above the absorption temperature.

According to various embodiments, the constituent may include or be formed from a dopant of the semiconductor region.

According to various embodiments, a method for processing a semiconductor region, wherein the semiconductor region comprises at least one precipitate (e.g., at least one dopant precipitate), may include: forming a precipitate removal layer over the semiconductor region, wherein the precipitate removal layer may define an absorption temperature at which a chemical solubility of a constituent of the at least one precipitate (e.g., a dopant material from the at least one dopant precipitate) may be greater in the precipitate removal layer than in the semiconductor region; and heating the at least one precipitate (e.g., via at least one of the precipitate removal layer and/or the semiconductor region) above the absorption temperature.

According to various embodiments, heating at least one of: the at least one precipitate (e.g., the at least one dopant precipitate), the semiconductor region and the precipitate removal layer above the absorption temperature may include thermally activating absorption of the dopant from the at least one precipitate (e.g., the at least one dopant precipitate) in the precipitate removal layer.

According to various embodiments, heating at least one of: the at least one precipitate (e.g., the at least one dopant precipitate), the semiconductor region and the precipitate removal layer above the absorption temperature may include activating thermally induced interdiffusion of the dopant from the semiconductor region into the precipitate removal layer.

According to various embodiments, a method for processing a semiconductor region, wherein the semiconductor region comprises a dopant, may include: forming a precipitate removal layer over the semiconductor region, wherein the precipitate removal layer may define an absorption temperature at which a chemical solubility of the dopant in the precipitate removal layer may be greater than in the semiconductor region; and activating a thermally induced absorption of the dopant from the semiconductor region (e.g., from the at least one precipitate) into the precipitate removal layer by heating above the absorption temperature (e.g., for planarizing the semiconductor region).

According to various embodiments, the semiconductor region may include or be formed from at least two phases differing from each other.

According to various embodiments, a first phase (also referred to as precipitate phase) of the at least two phases may protrude from a second phase (also referred to as host phase) of the at least two phases.

According to various embodiments, a first phase (also referred to as precipitate phase) of the at least two phases may be partially embedded in the second phase (also referred to as host phase) of the at least two phases.

According to various embodiments, a method for processing a semiconductor region, wherein the semiconductor region comprises a dopant, may include: forming a precipitate removal layer over the semiconductor region; wherein the precipitate removal layer may define an absorption temperature at which a thermally induced absorption of the dopant in the precipitate removal layer may be greater than in at least one precipitate (e.g., at least one dopant precipitate); and heating the precipitate removal layer above the absorption temperature so as to at least partially dissolve (in other words, decompose) at least one precipitate (e.g., at least one dopant precipitate) at the semiconductor region and absorb dopant material from the at least one precipitate (e.g., the at least one dopant precipitate) in the precipitate removal layer.

According to various embodiments, a thermally induced absorption of the dopant in the precipitate removal layer may be faster than in the at least one precipitate (e.g., the at least one dopant precipitate) above the absorption temperature.

According to various embodiments, an amorphous phase may be at least one of formed and maintained by the absorption of the dopant in the precipitate removal layer.

According to various embodiments, the precipitate removal layer may be configured to attract the dopant from the at least one precipitate (e.g., the at least one dopant precipitate) above the absorption temperature.

According to various embodiments, the precipitate removal layer may include or be formed from a dopant absorption material different than the dopant.

According to various embodiments, the precipitate removal layer may include or be formed from a dopant absorption material different than the dopant, wherein the dopant absorption material may provide the chemical solubility of the dopant in the precipitate removal layer.

According to various embodiments, the precipitate removal layer may be configured to decompose the at least one precipitate (e.g., the at least one dopant precipitate) above the absorption temperature.

According to various embodiments, the at least one precipitate (e.g., the at least one dopant precipitate) may include a semiconductor material of the semiconductor region.

According to various embodiments, the at least one precipitate (e.g., the at least one dopant precipitate) may include or be formed from a compound of a semiconductor material of the semiconductor region and the dopant.

According to various embodiments, the at least one precipitate (e.g., the at least one dopant precipitate) may include or be formed from a binary compound.

According to various embodiments, at least one precipitate (e.g., the at least one dopant precipitate) may include or be formed from a protrusion of the semiconductor region.

According to various embodiments, the at least one precipitate (e.g., the at least one dopant precipitate) may include or be formed from at least one crystalline phase.

According to various embodiments, the semiconductor region may be planarized during the heating (e.g., during the thermally induced absorption).

According to various embodiments, the precipitate removal layer may include or be formed from an amorphous phase.

According to various embodiments, the precipitate removal layer may remain amorphous during heating (e.g., during the thermally induced absorption).

According to various embodiments, for activating the thermally induced absorption, the precipitate removal layer may be heated to a temperature less than a temperature at which the precipitate removal layer crystallizes (e.g., while absorbing the dopant).

According to various embodiments, the semiconductor region may include or be formed from an electronic element.

According to various embodiments, the semiconductor region may include or be formed from a power electronic element.

According to various embodiments, the semiconductor region may include or be formed from at least one diode.

According to various embodiments, the semiconductor region may include or be formed from at least one transistor.

According to various embodiments, the precipitate removal layer may be electrically conductive.

According to various embodiments, the method may further include forming a metallization over the semiconductor region.

According to various embodiments, the metallization may be formed on a side on the semiconductor region on which the precipitate removal layer 604 may be disposed (e.g., over the precipitate removal layer).

According to various embodiments, the metallization may be electrically connected to an electronic element of the semiconductor region.

According to various embodiments, the metallization may include or be formed from at least one of zinc, nickel, aluminum, silicon and copper.

According to various embodiments, the method may further include forming a further metallization for contacting the semiconductor region at a side of the semiconductor region opposite at least one of the metallization and the precipitate removal layer.

According to various embodiments, the method may further include at least one of chemically activating and distributing the dopant in the semiconductor region by heating the semiconductor region.

According to various embodiments, the dopant may be configured to reduce an electron lifetime of the semiconductor region. In other words, the dopant may reduce a lifetime of free electrons in the semiconductor region.

According to various embodiments, the dopant may include or be formed from an electron lifetime killer.

According to various embodiments, the method may further include removing remaining dopant disposed over the semiconductor region before forming the precipitate removal layer.

According to various embodiments, a resistance of the at least one precipitate (e.g., the at least one dopant precipitate) against the removing (more generally, against an at least one of chemical and mechanical subtractive manufacturing) may be greater than a resistance of the semiconductor material of the semiconductor region against the removing (more generally, against the at least one of chemical and mechanical subtractive manufacturing).

According to various embodiments, a mechanical resistivity of the at least one precipitate (e.g., the at least one dopant precipitate) may be greater than a mechanical resistivity of the semiconductor material of the semiconductor region.

According to various embodiments, a chemical resistivity of the at least one precipitate (e.g., the at least one dopant precipitate) may be greater than a chemical resistivity of the semiconductor material of the semiconductor region.

According to various embodiments, a mechanical hardness of the at least one precipitate (e.g., the at least one dopant precipitate) may be greater than a mechanical hardness of the semiconductor material of the semiconductor region.

According to various embodiments, the at least one precipitate (e.g., the at least one dopant precipitate) may be disposed between a semiconductor material of the semiconductor region and the precipitate removal layer.

According to various embodiments, the dopant may include or be formed from a first metal.

According to various embodiments, the precipitate removal layer may include or be formed from at least one second metal.

According to various embodiments, the dopant may include or be formed from a first metal; and the precipitate removal layer may include or be formed from at least one second metal different than the first metal.

According to various embodiments, the dopant may include or be formed from platinum; and the precipitate removal layer may include or be formed from tungsten.

According to various embodiments, the dopant may include or be formed from at least one of platinum, aluminum, nickel, molybdenum, titan and copper.

According to various embodiments, a method for processing a semiconductor region may include: doping the semiconductor region with platinum; forming a precipitate removal layer comprising tungsten over the semiconductor region, wherein the precipitate removal layer may define an absorption temperature at which a chemical solubility of platinum in the precipitate removal layer may be greater than in the semiconductor region; and thermally activating absorption of platinum from (e.g., platinum precipitates of) the semiconductor region in the precipitate removal layer by heating above the absorption temperature (e.g., for planarizing the semiconductor region).

According to various embodiments, the at least one precipitate (e.g., the at least one dopant precipitate) may be consumed by heating the precipitate removal layer.

According to various embodiments, a method for processing a semiconductor region may include: doping the semiconductor region with platinum; forming a platinum layer over the semiconductor region; heating the semiconductor region and the platinum layer to an absorption temperature so as to induce absorption of platinum from (e.g., platinum precipitates of) the semiconductor region in the platinum layer (e.g., for planarizing the semiconductor region). In one or more embodiments, the semiconductor region may include or may be made from silicon. In one or more embodiments, the absorption temperature may be greater than or equal to about 400° C., e.g. in the range from about 450° C. to about 900° C. The temperatures within a furnace may vary due technological inhomogeneities, for example, up to 10° C. or less.

According to various embodiments, the absorption temperature may be greater than (e.g., more than about 150%, more than about 200%, more than about 300%, more than about 400%, or more than about 500% of) at least one of the following: the reference temperature, the doping temperature (e.g., at least one of the first doping temperature and the second doping temperature); and the precipitate formation temperature, for example, more or equal to about 400° C., e.g. more or equal to about 600° C., e.g., more or equal to about 800° C., e.g., more or equal to about 1000° C., e.g., in the range from about 600° C. to about 1500° C.

Alternatively or additionally, the absorption temperature may be less than at least one of the following: the recrystallization temperature and the melting temperature, for example, less or equal to about 2000° C., e.g., less or equal to about 1500° C., e.g., less or equal to about 1000° C., e.g., less or equal to about 800° C., e.g., in the range from about 600° C. to about 1500° C.

According to various embodiments, an electronic device may include: a semiconductor region including a dopant; a precipitate removal layer disposed over the semiconductor region, wherein a chemical solubility of the dopant in the precipitate removal layer may be greater than in the semiconductor region; and wherein the precipitate removal layer may include the dopant.

According to various embodiments, the precipitate removal layer may include or be formed from an amorphous phase including the dopant.

According to various embodiments, the precipitate removal layer may include or be formed from a dopant absorption material (e.g., in an amorphous phase) different than the dopant, wherein the dopant absorption material may define the chemical solubility of the dopant in the precipitate removal layer.

According to various embodiments, the precipitate removal layer may be configured to attract the dopant from the at least one precipitate (e.g., the at least one dopant precipitate) above the absorption temperature.

According to various embodiments, the precipitate removal layer may be configured to decompose the at least one precipitate (e.g., the at least one dopant precipitate) above the absorption temperature.

According to various embodiments, the at least one precipitate (e.g., the at least one dopant precipitate) may include or be formed from a semiconductor material of the semiconductor region.

According to various embodiments, the at least one precipitate (e.g., the at least one dopant precipitate) may include or be formed from a compound of a semiconductor material of the semiconductor region and the dopant.

According to various embodiments, the at least one precipitate (e.g., the at least one dopant precipitate) may include or be formed from a binary compound.

According to various embodiments, the at least one precipitate (e.g., the at least one dopant precipitate) may include or be formed from a crystalline phase.

According to various embodiments, the precipitate removal layer may be configured to remain amorphous up to the absorption temperature (e.g., for activating the thermally induced absorption of the dopant into the precipitate removal layer).

According to various embodiments, the absorption temperature may be less than a temperature activating a crystallization of the precipitate removal.

According to various embodiments, the semiconductor region may include or be formed from an electronic element.

According to various embodiments, the semiconductor region may include or be formed from a power electronic element.

According to various embodiments, the semiconductor region may include or be formed from at least one diode.

According to various embodiments, the semiconductor region may include or be formed from at least one transistor.

According to various embodiments, the precipitate removal layer may be electrically conductive.

According to various embodiments, an interface between the semiconductor region and the precipitate removal layer may be free of the at least one precipitate (e.g., the at least one dopant precipitate).

According to various embodiments, the electronic device may further include a metallization disposed over the precipitate removal layer.

According to various embodiments, the metallization may be electrically connected to an electronic element of the semiconductor region.

According to various embodiments, the metallization may include or be formed from at least one of zinc, nickel, aluminum, silicon and copper.

According to various embodiments, the electronic device may further include a further metallization for contacting the semiconductor region disposed at a side of the semiconductor region opposite at least one of the metallization and the precipitate removal layer.

According to various embodiments, the dopant in the semiconductor region may be chemically activated.

According to various embodiments, the dopant may be configured to reduce an electron lifetime of the semiconductor region.

According to various embodiments, the dopant may include or be formed from an electron lifetime killer.

According to various embodiments, a mechanical resistivity of the at least one precipitate (e.g., the at least one dopant precipitate) may be greater than a mechanical resistivity of the semiconductor region.

According to various embodiments, a chemical resistivity of the at least one precipitate (e.g., the at least one dopant precipitate) may be greater than a chemical resistivity of the semiconductor region.

According to various embodiments, a mechanical hardness of the at least one precipitate (e.g., the at least one dopant precipitate) may be greater than a mechanical hardness of the semiconductor region.

According to various embodiments, the precipitate removal layer may include or be formed from a material (also referred to as dopant absorption material) different than the dopant.

According to various embodiments, in the dopant may include or be formed from a first metal.

According to various embodiments, the precipitate removal layer may include or be formed from at least one second metal.

According to various embodiments, the dopant may include or be formed from a first metal; and the precipitate removal layer may include or be formed from at least one second metal different than the first metal.

According to various embodiments, the dopant may include or be formed from platinum; and wherein the precipitate removal layer may include or be formed from tungsten.

According to various embodiments, the dopant may include or be formed from at least one of platinum, aluminum, nickel, molybdenum, titan and copper.

According to various embodiments, a method for processing a semiconductor region may include: doping the semiconductor region by a dopant; forming a precipitate removal layer over the semiconductor region, wherein the precipitate removal layer may define an absorption temperature at which a chemical solubility of the dopant in the precipitate removal layer may be greater than in the semiconductor region; and thermally activating absorption of the dopant from the semiconductor region (e.g., from at least one precipitate of semiconductor region) in the precipitate removal layer by heating above the absorption temperature (e.g., for planarizing the semiconductor region).

According to various embodiments, doping the semiconductor region may include or be formed from: disposing the dopant at least one of in and over the semiconductor region; and activating at least one of a thermally induced diffusion of the dopant into or through the semiconductor region and a thermally induced activation of the dopant by heating the semiconductor region.

According to various embodiments, doping the semiconductor region may include or be formed from: removing remaining dopant from the thermally induced diffusion of the dopant into the semiconductor region.

According to various embodiments, the at least one precipitate (e.g., the at least one dopant precipitate) may be formed during doping the semiconductor region.

According to various embodiments, the at least one precipitate (e.g., the at least one dopant precipitate) may form at least one protrusion of the semiconductor region.

According to various embodiments, the precipitate removal layer may be structured for adapting a spatial planarization intensity.

According to various embodiments, the precipitate removal may include one or more openings exposing the semiconductor region.

According to various embodiments, a precipitate removal layer may be formed over one or more areas at a front side or back side of a wafer (more generally, semiconductor region), and subsequently the wafer may be heated so as to activate a migration of the dopant from the one or more areas of the wafer (which are covered by the precipitate removal layer) into the precipitate removal layer. In one or more embodiments, the one or more areas of the wafer constitute a fraction of the entire front side or back side area of the wafer. In other words, one or more areas at the front side or backside of the wafer may remain uncovered by the precipitate removal layer. In one or more embodiments, heating the wafer may include irradiating the entire front side or back side area of the wafer (either sequentially, e.g. by scanning, e.g. laser scanning, or simultaneously, e.g. by exposure, e.g., to at least one optical radiation and heat radiation), including the one or more areas of the wafer covered by the precipitate removal layer and the one or more areas of the wafer uncovered by the precipitate removal layer. In one or more embodiments, migration of the dopant into the precipitate removal layer occurs substantially only in the one or more areas of the wafer covered by the precipitate removal layer.

According to various embodiments, a metallization may include or be formed from more than one sub-layers (e.g., metal alloy layers and/or metal layers) differing in its chemical composition from each other.

According to various embodiments, the at least one precipitate (e.g., the at least one dopant precipitate) may refer to as one or more precipitates (e.g., a plurality of precipitates). The individual precipitates may be disposed distant from each other (in other words, separated from each other).

According to various embodiments, the at least one dopant precipitate (more generally at least one precipitate) of the semiconductor region may include or be formed from at least one microscopic precipitate (in other words, in micrometer scale), e.g., having an extension less than about 100 micrometer (µm), e.g., less than about 10 µm, e.g., less than about 1 µm, e.g., less than about 0.1 µm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor region, wherein the semiconductor region comprises at least one precipitate, the method comprising:
   forming a precipitate removal layer over the semiconductor region, wherein at an absorption temperature a chemical solubility of a constituent of the at least one precipitate is greater in the precipitate removal layer than in the semiconductor region; and
   heating the at least one precipitate above the absorption temperature,
   wherein an amorphous phase of the precipitate removal layer is at least one of formed and maintained by the absorption of the constituent in the precipitate removal layer.

2. The method of claim 1,
   wherein heating the at least one precipitate above the absorption temperature comprises:
   thermally activating absorption of the constituent from at least one precipitate in the precipitate removal layer.

3. The method of claim 1,
   wherein the constituent comprises a dopant material of the semiconductor region.

4. The method of claim 1,
   wherein the precipitate removal layer comprises a material different than the constituent.

5. The method of claim 1,
   wherein the precipitate removal layer is configured to decompose the at least one precipitate above the absorption temperature.

6. The method of claim 1,
   wherein the at least one precipitate comprises a semiconductor material of the semiconductor region.

7. The method of claim 1,
   wherein at least one precipitate forms a protrusion of the semiconductor region.

8. The method of claim 1,
   wherein the at least one precipitate comprises a crystalline phase.

9. The method of claim 1,
   wherein the semiconductor region is planarized during the heating.

10. The method of claim 1,
    wherein the semiconductor region comprises an electronic element.

11. The method of claim 1,
    wherein the precipitate removal layer is electrically conductive.

12. The method of claim 1, further comprising:
    forming a metallization over the precipitate removal layer.

13. The method of claim 12,
    wherein the metallization comprises at least one of zinc, nickel, aluminum, silicon and copper.

14. The method of claim 1, further comprising:
    forming a further metallization for contacting the semiconductor region at a side of the semiconductor region opposite the precipitate removal layer.

15. The method of claim 1,
    wherein the constituent is configured to reduce an electron lifetime of the semiconductor region.

16. The method of claim 1, further comprising:
    removing remaining constituent disposed over the semiconductor region before forming the precipitate removal layer.

17. The method of claim 1,
    wherein a mechanical hardness of the at least one precipitate is greater than a mechanical hardness of a semiconductor material of the semiconductor region.

18. A method for processing a semiconductor region, wherein the semiconductor region comprises a dopant, the method comprising:
    forming a precipitate removal layer over the semiconductor region,
    wherein at an absorption temperature a chemical solubility of the dopant in the precipitate removal layer is greater than in the semiconductor region; and
    thermally activating absorption of the dopant from the semiconductor region in the precipitate removal layer by heating above the absorption temperature,
    wherein an amorphous phase of the precipitate removal layer is at least one of formed and maintained by the absorption of the constituent in the precipitate removal layer.

19. A method for processing a semiconductor region, the method comprising:
    doping the semiconductor region with platinum;
    forming a precipitate removal layer comprising tungsten over the semiconductor region, wherein at an absorption temperature a chemical solubility of platinum in the precipitate removal layer is greater than in the semiconductor region; and thermally activating absorption of platinum from the semiconductor region in the precipitate removal layer by heating above the absorption temperature.

* * * * *